US008831055B2

(12) United States Patent
Watanabe et al.

(10) Patent No.: US 8,831,055 B2
(45) Date of Patent: Sep. 9, 2014

(54) SELF-OSCILLATING SEMICONDUCTOR LASER DEVICE AND DRIVING METHOD THEREOF

(75) Inventors: Hideki Watanabe, Kanagawa (JP); Masaru Kuramoto, Kanagawa (JP); Takao Miyajima, Kanagawa (JP); Hiroyuki Yokoyama, Miyagi (JP)

(73) Assignee: Sony Corporation, Tokyo (JP)

( * ) Notice: Subject to any disclaimer, the term of this patent is extended or adjusted under 35 U.S.C. 154(b) by 26 days.

(21) Appl. No.: 13/035,585

(22) Filed: Feb. 25, 2011

(65) Prior Publication Data

US 2011/0216797 A1  Sep. 8, 2011

(30) Foreign Application Priority Data

Mar. 5, 2010 (JP) ................. P2010-049750

(51) Int. Cl.
*H01S 3/13* (2006.01)
*H01S 5/30* (2006.01)
*H01S 5/343* (2006.01)

(52) U.S. Cl.
CPC .. *H01S 5/30* (2013.01); *H01S 5/343* (2013.01)
USPC .............. 372/30; 372/29.013; 372/38.05; 372/87

(58) Field of Classification Search
CPC ... H01S 5/0601; H01S 5/0607; H01S 5/0614; H01S 5/2219; H01S 5/321; H01S 5/3407
USPC ............... 372/29.013, 38.05, 87, 30
See application file for complete search history.

(56) References Cited

U.S. PATENT DOCUMENTS 8,076,165 B2   12/2011 Tsuda et al.
2006/0227818 A1* 10/2006 Gubenko et al. ............ 372/18
(Continued)

FOREIGN PATENT DOCUMENTS

JP   2004-007002   1/2004
JP   2004-186678   7/2004
(Continued)

OTHER PUBLICATIONS

Miyajima et al., "Picosend optical pulse generation from self-pulsating bisectional GaN-based blue-violet laser diodes", Applied Physics Letters, 2009, pp. 161103-1 to 161103-3, vol. 94.
(Continued)

*Primary Examiner* — Tod T Van Roy
(74) *Attorney, Agent, or Firm* — K&L Gates LLP

(57) ABSTRACT

There is provided a driving method of a self-oscillating semiconductor laser device including a first compound semiconductor layer having a first conductive type and composed of a GaN base compound semiconductor, a third compound semiconductor layer and a second compound semiconductor layer configuring an emission region and a saturable absorption region, are successively laminated, a second electrode formed on the second compound semiconductor layer, and a first electrode electrically connected to the first compound semiconductor layer. The second electrode is separated into a first portion to create a forward bias state by passing current to the first electrode via the emission region and a second portion to apply an electric field to the saturable absorption region by a separation groove. The current greater than a current value where kink is occurred in optical output-current characteristics is to be passed to the first portion of the second electrode.

19 Claims, 14 Drawing Sheets

(56) References Cited

U.S. PATENT DOCUMENTS

| | | | |
|---|---|---|---|
| 2010/0020838 A1* | 1/2010 | Oota et al. | 372/45.013 |
| 2010/0142570 A1* | 6/2010 | Konttinen et al. | 372/22 |
| 2011/0216788 A1* | 9/2011 | Oki et al. | 372/18 |
| 2012/0147917 A1* | 6/2012 | Oki et al. | 372/45.013 |
| 2012/0236886 A1* | 9/2012 | Oki et al. | 372/38.02 |

FOREIGN PATENT DOCUMENTS

| | | |
|---|---|---|
| JP | 2004-188678 | 7/2004 |
| JP | 2008-047692 | 2/2008 |
| JP | 2010-027935 | 2/2010 |
| WO | 2006/112167 | 10/2006 |

OTHER PUBLICATIONS

Japanese Office Action issued Jan. 28, 2014 for corresponding Japanese Appln. No. 2010-049750.

* cited by examiner

SELF-OSCILLATING SEMICONDUCTOR LASER DEVICE AND DRIVING METHOD THEREOF

CROSS REFERENCES TO RELATED APPLICATIONS

The present application claims priority to Japanese Patent Application JP 2010-049750 filed on Mar. 5, 2010, the entire contents of which is hereby incorporated by reference.

BACKGROUND

The present disclosure relates to a self-oscillating semiconductor laser device and a driving method thereof.

Ultrashort pulse/ultrahigh output lasers are actively used for research in advanced scientific fields using laser light whose pulse time is in attosecond or femtosecond. Moreover, a high output ultrashort pulse semiconductor laser device composed of GaN-base compound semiconductor and whose luminous wavelength is in the 405 nm band is expected as a light source of a volume type optical disk system expected as a next-generation optical disk system after the Blu-ray optical disk system and also as a light source demanded from the medical field, bio-imaging field and the like.

A titanium/sapphire laser, for example, is known as an ultrashort pulse/ultrahigh output laser, but the titanium/sapphire laser is an expensive large solid-state laser light source, which constitutes a main factor inhibiting widespread use of the technology. Realization of the ultrashort pulse/ultrahigh output laser by a semiconductor laser or a semiconductor laser device will cause significant miniaturization, cost reduction, and high-level stabilization and is considered to be a breakthrough to promote widespread use thereof in these fields.

On the other hand, research on shorter pulses of a semiconductor laser device has actively been done in the field of communications systems since the 1960s. The gain switching, the loss switching (Q switching), and the mode locking are known as methods of causing a semiconductor laser device to generate shorter pulses and these methods aim for higher output by combining the semiconductor laser device with a semiconductor amplifier, nonlinear optical element, optical fiber or the like. As a method for generating short optical pulses in the semiconductor laser device, two kinds of method of the gain switching and the mode locking are mainly well known, and the mode locking is further divided into active mode locking and passive mode locking. To generate an optical pulse based on the active mode locking, an external resonator is constructed using mirrors and lenses and further it is necessary that radio frequency (RF) modulation is applied to the semiconductor laser device. For the passive mode locking, on the other hand, an optical pulse may be generated by simple DC driving using a semiconductor laser device having a multi-electrode structure.

It is necessary to provide emission regions and saturable absorption regions in a semiconductor laser device to cause a self-pulsation operation of the semiconductor laser device. Based on an arrangement state of emission regions and saturable absorption regions, the semiconductor laser device may be classified into a SAL (Saturable Absorber Layer) type or WI (Weakly Index guide) type in which emission regions and saturable absorption regions are arranged in a vertical direction and a multi-electrode type including a bi-section type in which emission regions and saturable absorption regions are arranged in a resonator direction. A bi-section type semiconductor laser device is known from Japanese Patent Application Laid-Open Nos. 2004-007002, 2004-188678, and 2008-047692. Compared with a SAL type semiconductor laser device, a multi-electrode type GaN base semiconductor laser device has a larger effect of saturable absorption and is considered to be able to generate optical pulses whose width is narrow.

SUMMARY

In order to self-oscillate a multi-electrode type semiconductor laser device, a forward bias current $I_{gain}$ is to be passed to an emission region and forward bias or reverse bias voltage $V_{sa}$ are to be applied to a saturable absorption region. In the past, when the multi-electrode type semiconductor laser device is self-oscillated, if bias voltage $V_{sa}$ to be applied to the saturable absorption region is stable, relationship of $(dF/dL) > 0$ exists between a self-oscillating frequency F and a mean light output L. In other words, if the mean light output L is increased, the self-oscillating frequency F is also increased. Subsequently, pulse width or peak output of laser pulses to be generated is hardly changed. For that reason, it is desirable to increase absolute value of the reverse bias voltage $V_{sa}$ to be applied to the saturable absorption region in order to realize shorter pulses or higher peak output of optical pulse to be generated. However, since such operation increases threshold current, the forward bias current $I_{gain}$ is necessary to be increased at the time of self-oscillating operation, which causes fever and deterioration of the semiconductor laser device.

Therefore, it is desirable to provide a self-oscillating semiconductor laser device configured to be able to realize shorter pulses or higher peak output of optical pulse to be generated and a driving method thereof without causing fever or deterioration.

A driving method of a self-oscillating semiconductor laser device in to attain the above purpose includes each process of:

(a) a laminated structure formed by successively stacking a first compound semiconductor layer having a first conductive type and composed of a GaN base compound, a third compound semiconductor layer constituting emission regions and saturable absorption regions composed of a GaN base compound, and a second compound semiconductor layer having a second conductive type that is different from the first conductive type and composed of a GaN base compound;

(b) a second electrode formed on the second compound semiconductor layer; and (c) a first electrode electrically connected to the first compound semiconductor layer, The second electrode is separated into a first portion to create a forward bias state by passing current to the first electrode via the emission region and a second portion to apply an electric field to the saturable absorption region by a separation groove.

Current greater than a current value where kink is occurred in optical output-current characteristics is to be passed to the first portion of the second electrode. A forward bias state is created by passing the current from the first portion of the second electrode to the first electrode via the emission region and an electric field is applied to the saturable absorption region by applying the forword bias voltage to between the first electrode and the second portion of the second electrode to carry out self-oscillating driving.

The self-oscillating semiconductor laser device according to a first embodiment and a second embodiment includes:

(a) a laminated structure formed by successively stacking a first compound semiconductor layer having a first conductive type and composed of a GaN base compound, a third compound semiconductor layer constituting emission regions and saturable absorption regions composed of a GaN base compound, and a second compound semiconductor layer having a second conductive type that is different from the first conductive type and composed of a GaN base compound;

(b) a second electrode formed on the second compound semiconductor layer; and (c) a first electrode electrically connected to the first compound semiconductor layer.

The second electrode is separated into a first portion to create a forward bias state by passing the current to the first electrode via the emission region and a second portion to apply an electric field to the saturable absorption region by a separation groove.

The third compound semiconductor layer includes a quantum well structure having a well layer and a barrier layer.

A region of the second compound semiconductor layer apart from the third compound semiconductor layer is mounted with an electron barrier layer having more than 10 nm thick, and a distance between the electron barrier layer and the third compound semiconductor layer is $4.5 \times 10^{-8}$ m or more and or $8 \times 10^{-8}$ m or less.

Further, in the self-oscillating semiconductor laser device according to the first embodiment, there is relationship of $(dF/dL)<0$ between the self-oscillating frequency F and the mean light output L when the current greater than the current value where kink is occurred in optical output-current characteristics is to be passed to the first portion of the second electrode. Moreover, in the self-oscillating semiconductor laser device according to the second embodiment, there is relationship of $(dF/dI)<0$ between the self-oscillating frequency F and the current value I to be passed to the first portion of the second electrode when the current greater than the current value where kink is occurred in optical output-current characteristics is to be passed to the first portion of the second electrode.

In the method for driving the self-oscillating semiconductor laser device according to the embodiment, current greater than the current value where kink is occurred in optical output-current characteristics is to be passed to the first portion of the second electrode. When the current greater than the current value where kink is occurred in optical output-current characteristics is to be passed to the first portion of the second electrode, there still is no clear reason, cause, or function or the like found. However, in the self-oscillating semiconductor laser device of the first embodiment, there is the relationship of $(dF/dL)<0$ between the self-oscillating frequency F and the mean light output L, and in the self-oscillating frequency of the second embodiment, there is the relationship of $(dF/dI)<0$ between the self-oscillating frequency F and the current value I to be passed to the first portion of the second electrode. As the result, a pulse width W becomes narrow as the mean light output L increases, and the peak output substantially increases as the mean light output L increases. Further, it has become possible to realize higher output of optical pulses than any kind of self-oscillating semiconductor laser device of a DC current driving that has been reported in the past.

Additional features and advantages are described herein, and will be apparent from the following Detailed Description and the figures.

DETAILED DESCRIPTION

Figure 1:
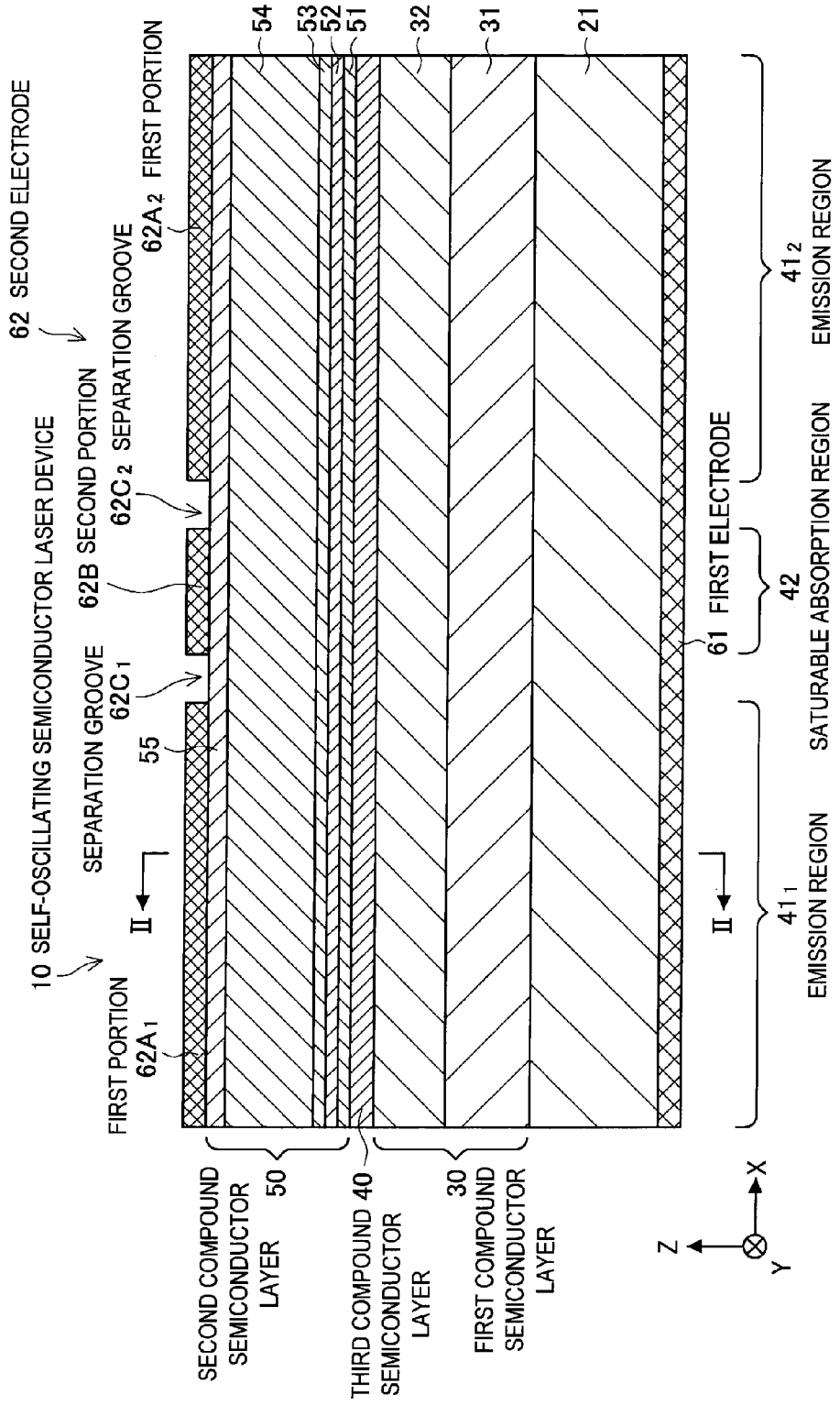
FIG. 1 is a schematic end face view along a direction in which a resonator of a self-oscillating semiconductor laser device of Example 1 extends.

Hereinafter, preferred embodiments will be described in detail with reference to the appended drawings. Note that, in this specification and the appended drawings, structural elements that have substantially the same function and structure are denoted with the same reference numerals, and repeated explanation of these structural elements is omitted. Explanation will be described hereinafter in the following order:

1. General Description including a Method for Driving a Self-oscillating Semiconductor Laser Device, and the first and second embodiments thereof; and 2. Example 1 (a Method for Driving a Self-oscillating Semiconductor Laser Device, and the first and second embodiments thereof, etc.), and others.

(General Description Including a Method for Driving a Self-Oscillating Semiconductor Laser Device, and the First and Second Embodiments Thereof)

For the method for driving of the self-oscillating semiconductor laser device or the first or second embodiments thereof, it is desirable that the second portion of the second electrode is applied with reverse bias voltage $V_{sa}$ whose absolute value is 5 volt or more (that is, the second portion of the second electrode is to be applied with reverse bias voltage $V_{sa}$ −5 volt or less). A pulse current or a pulse voltage synchronized with the pulse current or the pulse voltage applied to the first portion of the second electrode may be applied to the second portion of the second electrode or a DC bias may be applied thereto.

The method for driving the self-oscillating semiconductor laser device in the present invention including the above-described preferred mode may be in a mode where a transverse-mode is a single mode.

Further, such method for driving the self-oscillating semiconductor laser device in the present invention including the above-described preferred mode may be configured to have the relationship of (dF/dL)<0 between the self-oscillating frequency F and the mean light output L or the relationship of (dF/dI)<0 between the self-oscillating frequency F and the current value I to be passed to the first portion of the second electrode.

Further, the method for driving the self-oscillating semiconductor laser device in the present invention including the above-described preferred mode may be configured so that:

the third compound semiconductor layer includes a quantum well structure having a well layer and a barrier layer, a region of the second compound semiconductor layer apart from the third compound semiconductor layer is mounted with an electron barrier layer having more than 10 nm thick, and a distance (d) between the electron barrier layer and the third compound semiconductor layer is $4.5 \times 10^{-8}$ m (45 nm) or more and or $8 \times 10^{-8}$ m (80 nm) or less. Note that $5 \times 10^{-8}$ m (50 nm) is not limited to, but may be the upper limit of the electron barrier layer. This is the same for the self-oscillating semiconductor laser device of the Examples 1 or 2.

The "distance (d) between the electron barrier layer and the third compound semiconductor layer" means a distance between a portion (boundary surface) of the electron barrier layer facing the third compound semiconductor layer and a portion (boundary surface) of the third compound semiconductor layer facing the electron barrier layer. The electron barrier layer is also called as a cap layer or an anti-evaporation layer, and is a layer mounted for reflecting electron from the first compound semiconductor layer contained an n-type impurity, and for preventing the electron from passing through the second compound semiconductor layer, that is, electron overflow. Limiting the distance (d) between the electron barrier layer and the third compound semiconductor layer to $8 \times 10^{-8}$ m (80 nm) or less, it is possible to prevent the electron barrier layer from being lower due to an energy band at the time of high current injection and to make an effective barrier height in the electron barrier layer higher.

The self-oscillating semiconductor laser device in the present invention according to the first or second embodiments may be in a mode where a transverse-mode is a single mode.

In the self-oscillating semiconductor laser device of the first or second embodiments in the present invention including the above preferred mode or configuration, or a method for driving the self-oscillating semiconductor laser device in the present invention (hereinafter, these self-oscillating semiconductor laser devices may generically be referred to as simply a "self-oscillating semiconductor laser device in the present invention or the like"), the impurity doping density of the barrier layer can be configured to be 0 or more, and $5 \times 10^{18}$ cm$^{-3}$ or less. Here, the impurity may be silicon (Si) or oxygen (O).

Further, in a self-oscillating semiconductor laser device or the like in the present invention including the above preferred configuration, it is desirable that the value of electric resistance between the first portion and the second portion of the second electrode be $1 \times 10^{2} \Omega$ or more, preferably $1 \times 10^{3} \Omega$ or more particularly preferably $1 \times 10^{4} \Omega$ or more. Alternatively, it is desirable that the value of electric resistance between the first portion and the second portion of the second electrode be $1 \times 10$ times the value of electric resistance between the second electrode and the first electrode or more, preferably $1 \times 10^{2}$ times or more, particularly preferably $1 \times 10^{3}$ times or more.

Here, by setting the value of electric resistance between the first portion and the second portion of the second electrode to be $1 \times 10^{2}$ or more or 10 times the value of electric resistance between the second electrode and the first electrode or more, the flow of leakage current from the first portion of the second electrode to the second portion may surely be suppressed. That is, the current injected into emission regions (carrier injection regions, gain regions) may be increased and at the same time, a reverse bias voltage $V_{sa}$ applied to saturable absorption regions (carrier non-injection regions) may be raised. As a result, a single-mode self-pulsation operation having optical pulses with strong peak power may be realized. Moreover, such a large value of electric resistance between the first portion and the second portion of the second electrode may be achieved only by separating the second electrode into the first portion and the second portion by a separation groove. That is, optical pulse generation by mode locking may be realized easily.

Further, in a self-oscillating semiconductor laser device or the like in the present invention including the above-described preferred mode or configuration, it is desirable that the width of the separation groove that separates the second electrode into the first portion and the second portion be 1 μm or more and 50% of the resonator length or less, preferably 10 μm or more and 10% of the resonator length or less. 0.3 mm may be exemplified as the resonator length, but the length thereof is not limited to this. In the description that follows, the direction of a resonator is defined as the direction and the direction of thickness of a laminated structure as the Z direction.

Further, in a self-oscillating semiconductor laser device or the like in the present invention including the above-described preferred mode or configuration, the length of the second electrode (total length of the first portion and the second portion) is shorter than the length of the third compound semiconductor layer. Arrangement states of the first portion and the second portion of the second electrode include (1) a state in which two first portions of the second electrode and one second portion of the second electrode are provided, one edge of the second portion is opposite to one first portion sandwiching one separation groove therebetween, and the other edge of the second portion is opposite to the other first portion sandwiching the other separation groove therebetween (that is, the second electrode has a structure in which the second portion is sandwiched between the first portions), (2) a state in which one first portion of the second electrode and one second portion of the second electrode are provided and the first portion of the second electrode and the second portion of the second electrode are arranged sandwiching the separation groove therebetween, and (3) a state in which one first portion of the second electrode and two second portions of the second electrode are provided, one edge of the first portion is opposite to one second portion sandwiching one separation groove therebetween, and the other edge of the first portion is opposite to the other second portion sandwiching the other separation groove therebetween, and among others, it is desirable to adopt the structure of (1). More broadly, arrangement states of the first portions and the second portions of the second electrode include (4) a state in which N first portions of the second electrode and (N−1) second portions of the second electrode are provided and the first portions of the second electrode are arranged sandwiching the second portions of the second electrode therebetween and (5) a state in which N second portions of the second electrode and (N−1) first portions of the second electrode are provided and the second portions of the second electrode are arranged sandwiching the first portions of the second electrode therebetween. The states (4) and (5) are namely (4') a state in which N emission regions [carrier injection regions, gain regions] and (N−1) saturable absorption regions [carrier non-injection regions] are provided and the emission regions are arranged sandwiching the saturable absorption regions therebetween and (5') a state in which N saturable absorption regions [carrier non-injection regions] and (N−1) emission regions [carrier injection regions, gain regions] are provided and the saturable absorption regions are arranged sandwiching the emission regions therebetween. By adopting the structure of (1), (5), or (5'), the light emission end face of a self-oscillating semiconductor laser device may be made resistant to damage.

Further, a self-oscillating semiconductor laser device or the like in the present invention including the above-described preferred mode or configuration may be a semiconductor laser device having a ridge stripe type separate confinement heterostructure (SCH structure, Separate Confinement Heterostructure). It is desirable that the height of a ridge structure be 0.1 μm or more and 10 μm or less, preferably 0.2 μm or more and 1 μm or less, but the height is not limited to such examples. 2 μm or less may be exemplified as the width of a ridge structure and, for example, 0.8 μm may be cited as the width of a ridge structure, but the width is not limited to this. A distance (D) from a top face portion of the second compound semiconductor layer positioned outside from both side faces of the ridge portion to the third compound semiconductor layer is preferably $1.0 \times 10^{-7}$ m (0.1 μm) or more. By defining the distance (D) in this way, saturable absorption regions may reliably be formed on both sides (Y direction) of the third compound semiconductor layer. The upper limit of the distance (D) may be decided based on the rise in threshold current, temperature characteristics, degradation of the rate of rise in current when driven for a long time and the like.

A self-oscillating semiconductor laser device or the like in the present invention including the above-described preferred mode or configuration may be manufactured by, for example, the following method:

(A) After forming a laminated structure formed by successively stacking a first compound semiconductor layer having a first conductive type and composed of a GaN base compound, a third compound semiconductor layer constituting emission regions and saturable absorption regions composed of a GaN base compound, and a second compound semiconductor layer having a second conductive type that is different from the first conductive type and composed of a GaN base compound on a substrate, (B) a second electrode in a belt shape is formed on the second compound semiconductor layer and then, (C) after forming a ridge structure by etching at least a portion of the second compound semiconductor layer using the second electrode as an etching mask, and (D) a resist layer to form a separation groove in the second electrode is formed and then, the separation groove is formed in the second electrode by wet etching using the resist layer as a wet etching mask to separate the second electrode into a first portion and a second portion by the separation groove.

By adopting such a manufacturing method, namely a ridge structure is formed by etching at least a portion of the second compound semiconductor layer using the second electrode in a belt shape as an etching mask, that is, a ridge structure is formed by self alignment using the patterned second electrode as an etching mask and therefore, the second electrode and the ridge structure will not be misaligned. The separation groove is formed in the second electrode by wet etching. By adopting, in contrast to dry etching, wet etching in this manner, degradation in optical and electric characteristics may be suppressed. Therefore, emission characteristics may reliably be prevented from being degraded.

In Process (C), the second compound semiconductor layer may be etched partially in the thickness direction, the second compound semiconductor layer may be etched entirely in the thickness direction, the second compound semiconductor layer and the third compound semiconductor layer may be etched in the thickness direction, or the second compound semiconductor layer and the third compound semiconductor layer and further the first compound semiconductor layer may partially be etched in the thickness direction.

Further in Process (D), if the etching rate of the second electrode is $ER_0$ when a separation groove is formed in the second electrode and the etching rate of the laminated structure is $ER_1$, it is desirable to satisfy $ER_0/ER_1 \geq 1 \times 10$, preferably $ER_0/ER_1 \geq 1 \times 10^2$. With such a relation being satisfied by $ER_0/ER_1$, the second electrode may reliably be etched without the laminated structure being etched (or only slightly if etched).

In a self-oscillating semiconductor laser device or the like in the present invention, a mode in which the second electrode is composed of a palladium (Pd) single layer, a nickel (Ni) single layer, a platinum (Pt) single layer, a laminated structure of a palladium layer/platinum layer in which the palladium layer is in contact with the second compound semiconductor layer, or a laminated structure of a palladium layer/nickel layer in which the palladium layer is in contact with the second compound semiconductor layer may be adopted. If a lower metallic layer is constituted of palladium and an upper metallic layer is constituted of nickel, it is desirable that the thickness of the upper metallic layer be 0.1 μm or more, preferably 0.2 μm or more. Alternatively, it is preferable to configure the second electrode by the palladium (Pd) single layer and in this case, it is desirable that the thickness thereof be 20 nm or more, preferably 50 nm or more. Alternatively, it is preferable to configure the second electrode by the palladium (Pd) single layer, the nickel (Ni) single layer, the platinum (Pt) single layer, or a laminated structure of a lower metallic layer and an upper metallic layer in which the lower metallic layer is in contact with the second compound semiconductor layer (the lower metallic layer is constituted of one metal selected from a group of palladium, nickel, and platinum and the upper metallic layer is constituted of a metal whose etching rate when a separation groove is formed in the second electrode in Process (D) is equal to, equivalent to, or higher than the etching rate of the lower metallic layer). It is also desirable that the etchant used for forming a separation groove in the second electrode in Process (D) be aqua regia, nitric acid, sulfuric acid, hydrochloric acid, or a mixed solution of at least two of these acids (more specifically, a mixed solution of nitric acid and sulfuric acid or a mixed solution of sulfuric acid and hydrochloric acid). It is desirable that the width of the second electrode be 0.5 μm or more and 50 μm or less, preferably 1 μm or more and 5 μm or less.

In a self-oscillating semiconductor laser device or the like in the present invention including the above-described preferred configuration or mode, the laminated structure may more specifically be constituted of an AlGaInN base compound semiconductor. More specifically, GaN, AlGaN, GaInN, and AlGaInN may be cited as the AlGaInN base compound semiconductor. Further, these compound semiconductors may contain boron (B) atoms, thallium (Tl) atoms, arsenic (As) atoms, phosphorus (P) atoms, or antimony (Sb) atoms if desired. The third compound semiconductor layer (the third compound semiconductor layer may be called an "active layer") constituting emission regions (gain regions) and saturable absorption regions has a quantum well structure. More specifically, the third compound semiconductor layer may have a single quantum well structure [QW structure] or a multi-quantum well structure [MQW structure]. The active layer having a quantum well structure has a structure in which at least one well layer and one barrier layer are laminated and as a combination of (compound semiconductor constituting the well layer, compound semiconductor constituting the barrier layer), ($In_yGa_{(1-y)}N$, GaN), ($In_yGa_{(1-y)}N$, $In_zGa_{(1-z)}N$) [where y>z], and ($In_yGa_{(1-y)}N$, AlGaN) may be exemplified.

Further, in a self-oscillating semiconductor laser device or the like in the present invention including the above-described preferred configuration or mode, the second compound semiconductor layer may have a structure having a superlattice structure in which a p-type GaN layer and a p-type AlGaN layer are alternately laminated and whose thickness is 0.7 μm or less. By adopting such a superlattice structure, a series resistance component of the self-oscillating semiconductor laser device may be lowered while maintaining a high refractive index necessary as a clad layer, leading to a lower voltage operation of the self-oscillating semiconductor laser device. For example, 0.3 μm may be cited as the lower limit of the thickness of the superlattice structure, though not limited to this, 1 nm to 5 nm may be exemplified as the thickness of the p-type GaN layer constituting the superlattice structure, 1 nm to 5 nm may be exemplified as the thickness of the p-type AlGaN layer constituting the superlattice structure, and 60 layers to 300 layers may be exemplified as the total layers of the p-type GaN layer and the p-type AlGaN layer. The distance from the third compound semiconductor layer to the second electrode may be configured to be 1 μm or less, preferably 0.6 μm or less. By defining the distance from the third compound semiconductor layer to the second electrode in this way, the p-type second compound semiconductor layer with high resistance may be made thinner to achieve a lower operating voltage of the semiconductor laser device. The second compound semiconductor layer may be configured to be doped with $1 \times 10^{19}$ $cm^{-3}$ of Mg or more so that the absorption coefficient of light whose wavelength is 405 nm from the third compound semiconductor layer by the second compound semiconductor layer is at least 50 $cm^{-1}$. This atom density of Mg is derived from material properties that the maximum hole density is indicated when the value of density is $2 \times 10^{19}$ $cm^{-3}$ and is a result of design to achieve the maximum hole density, that is, the specific resistance of the second compound semiconductor layer is minimized. The absorption coefficient of the second compound semiconductor layer is defined from the standpoint of lowering the resistance of the semiconductor laser device as much as possible and, as a result, the absorption coefficient of the third compound semiconductor layer generally becomes 50 $cm^{-1}$. However, the amount of doped Mg may be intentionally set to $2 \times 10^{19}$ $cm^{-3}$ or more to increase the absorption coefficient. In such a case, the upper limit of the amount of doped Mg to obtain a practical hole density is, for example, $8 \times 10^{19}$ $cm^{-3}$. The second compound semiconductor layer has a non-doped compound semiconductor layer and a p-type compound semiconductor layer from the side of the third compound semiconductor layer and the distance from the third compound semiconductor layer to the p-type compound semiconductor layer may be configured to be $1.2 \times 10^{-7}$ m or less. By defining the distance from the third compound semiconductor layer to the p-type compound semiconductor layer in this way, internal losses may be suppressed within a range in which internal quantum efficiency does not fall. Accordingly, a lasting threshold current density $J_{th}$ at which laser oscillation is started may be reduced. For example, $5 \times 10^{-8}$ m may be cited as the lower limit of the distance from the third compound semiconductor layer to the p-type compound semiconductor layer, though not limited to this. A laminated dielectric film composed of an SiO2/Si laminated structure is formed on both side faces of the ridge portion and a difference between the effective refractive index of the ridge portion and that of the laminated dielectric film may be configured to be $5 \times 10^{-3}$ to $1 \times 10^{-2}$. By using such a laminated dielectric film, a single fundamental transverse mode may be maintained even for a high output operation exceeding 100 mW. The second compound semiconductor layer may have a structure in which, for example, a non-doped GaInN layer (p-side optical guide layer), a non-doped AlGaN layer (p-side clad layer), an Mg doped AlGaN layer (electron barrier layer), a superlattice structure of GaN layer (Mg doped)/AlGaN layer (superlattice clad layer), and an Mg doped GaN layer (p-side contact layer) are laminated from the side of the third compound semiconductor layer. It is desirable that the band gap of a compound semiconductor constituting a well layer in the third compound semiconductor layer be 2.4 eV or more. It is also desirable that the wavelength of laser light emitted from the third compound semiconductor layer be 360 nm to 500 nm, preferably 400 nm to 410 nm. It is needless to say that various configurations described above may suitably be combined.

In the second compound semiconductor layer, as described above, a non-doped compound semiconductor layer (for example, a non-doped GaInN layer or non-doped AlGaN layer) may be formed between the third compound semiconductor layer and the electron barrier layer. Further, a non-doped GaInN layer as an optical guide layer may be formed between the third compound semiconductor layer and the non-doped compound semiconductor layer. The second compound semiconductor layer may also a structure in which the top layer thereof is occupied by an Mg doped GaN layer (p-side contact layer).

Various GaN base compound semiconductor layers constituting a self-oscillating semiconductor laser device in the present invention are successively formed on a substrate and in addition to the sapphire substrate, a GaAs substrate, a GaN substrate, an SiC substrate, an alumina substrate, a ZnS substrate, a ZnO substrate, an AN substrate, an LiMgO substrate, an $LiGaO_2$ substrate, an $MgAl_2O_4$ substrate, an InP substrate, an Si substrate, and a substrate obtained by forming a foundation layer or buffer layer on the surface (principal plane) of one of these substrates may be cited as the substrate. Formation methods of various GaN base compound semiconductor layers constituting a self-oscillating semiconductor laser device include the metal organic chemical vapor deposition (MOCVD, MOVPE), the molecular beam epitaxy (MBE), and the hydride vapor deposition in which halogen contributes to transport or reactions.

A trimethylgallium (TMG) gas and a triethylgallium (TEG) gas may be cited as an organic gallium source gas for the MOCVD, and an ammonium gas and a hydrazine gas may be cited as nitrogen source gas. For example, silicon (Si) may be added as an n-type impurity (n-type dopant) for the formation of a GaN base compound semiconductor layer having an n-type conductive type and, for example, magnesium (Mg) may be added as a p-type impurity (p-type dopant) for the formation of a GaN base compound semiconductor layer having a p-type conductive type. If aluminum (Al) or indium (In) is contained as constituent atoms of a GaN base compound semiconductor layer, a trimethylaluminum (TMA) gas may be used as an Al source and a trimethylindium (TMI) gas as an In source. Further, a mono-silane gas ($SiH_4$ gas) may be used as an Si source and a cyclopentadienyl magnesium gas, methylcyclopentadienyl magnesium, or biscyclopentadienyl magnesium (Cp$_2$Mg) may be used as an Mg source. In addition to Si as an n-type impurity, Ge, Se, Sn, C, Te, S, O, Pd, and Po may be cited and, in addition to Mg as a p-type impurity, Zn, Cd, Be, Ca, Ba, C, Hg, and Sr may be cited.

If the first conductive type is of n type, it is desirable that the first electrode electrically connected to the first compound semiconductor layer having the n-type conductive type have a single-layer configuration or multi-layer configuration containing at least one metal selected from a group consisting of gold (Au), silver (Ag), palladium (Pd), aluminum (Al), titanium (Ti), tungsten (w), copper (Cu), zinc (Zn), tin (Sn), and indium (In) and, for example, Ti/Au, Ti/Al, and Ti/Pt/Au may be exemplified. The first electrode is electrically connected to the first compound semiconductor layer and this includes a mode in which the first electrode is formed on the first compound semiconductor layer and a mode in which the first electrode is connected to the first compound semiconductor layer via a conductive material layer or a conductive substrate. The first electrode and the second electrode may be formed by, for example, the vacuum evaporation method or PVD such as the sputtering method.

A pad electrode to electrically connect to an external electrode or circuit may be provided on the first electrode or the second electrode. It is desirable that the pad electrode have a single-layer configuration or multi-layer configuration containing at least one metal selected from a group consisting of titanium (Ti), aluminum (Al), platinum (Pt), gold (Au), and nickel (Ni). Alternatively, the pad electrode may have a multiplayer configuration exemplified by a Ti/Pt/Au multiplayer configuration or a Ti/Au multiplayer configuration.

A self-oscillating semiconductor laser device in the present invention or a driving method thereof may be applied to fields such as an optical disk system, communication field, optical information field, optoelectronic integrated circuit field, field in which nonlinear optical phenomena are applied, optical switch, laser measurement field and various analysis fields, ultrahigh spectroscopic field, multi-photon excitation spectroscopic field, mass spectrometry field, microspectroscopy field using multi-photon absorption, quantum control of chemical reactions, nano three-dimensional processing field, various processing fields using multi-photon absorption, medical field, and bio-imaging field.

Figure 2:
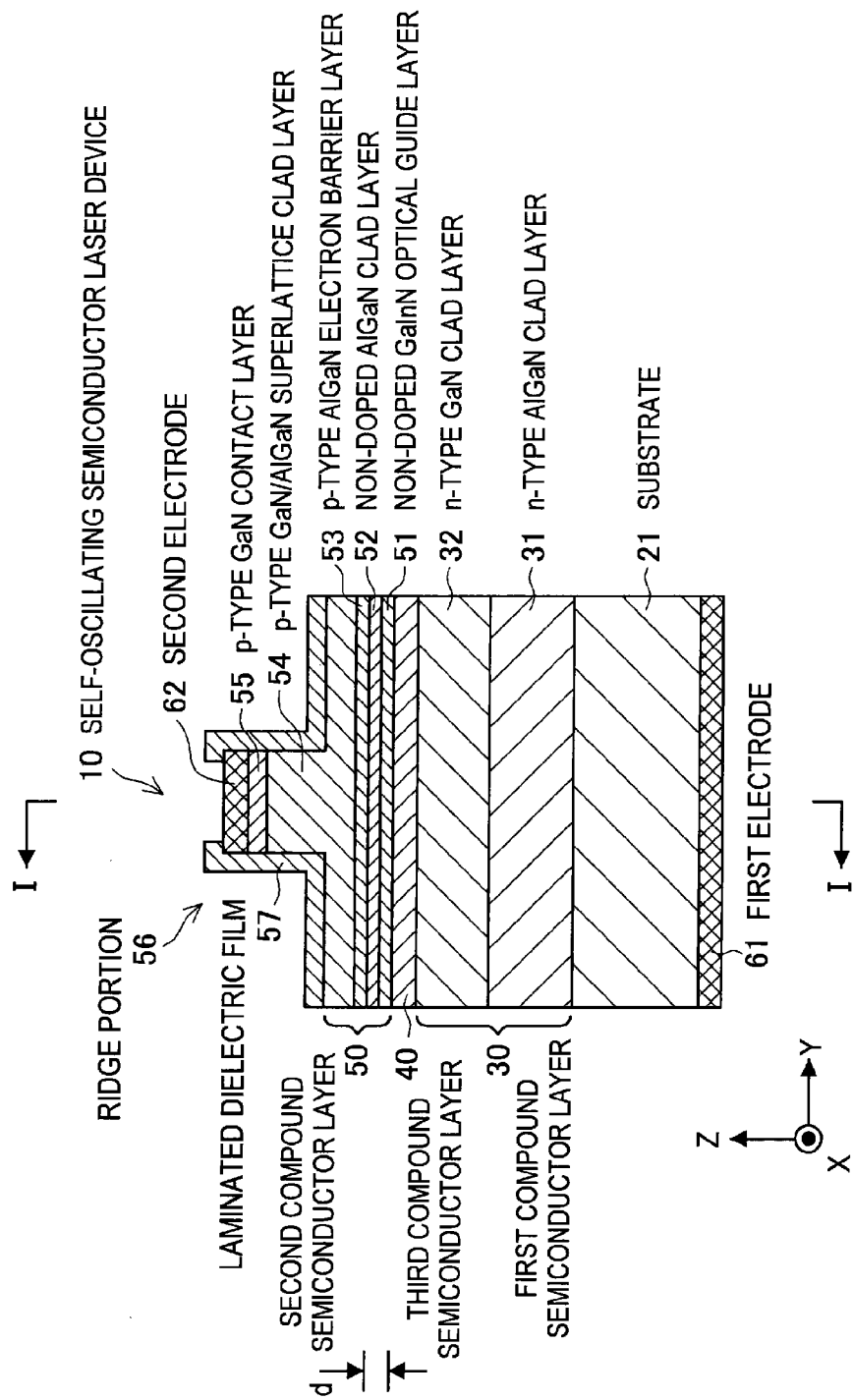
FIG. 2 is a schematic sectional view along the direction perpendicular to the direction in which the resonator of the self-oscillating semiconductor laser device of Example 1 extends.

Example 1 relates to a method for driving a self-oscillating semiconductor laser device in the present invention and the self-oscillating semiconductor laser device in the first embodiment and the second embodiment. FIG. 1 shows a schematic end face view (schematic end face view when cut by the XZ plane) along a direction in which a resonator of a self-oscillating semiconductor laser device of Example 1 extends and FIG. 2 shows a schematic sectional view (schematic sectional view when cut by the YZ plane) along the direction perpendicular to the direction in which the resonator of the self-oscillating semiconductor laser device of Example 1 extends. FIG. 1 is a schematic end face view along an arrow I-I in FIG. 2 and FIG. 2 is a schematic sectional view along an arrow II-II in FIG. 1.

A self-oscillating semiconductor laser device 10 of Example 1 whose luminous wavelength is in the 405 nm band includes;

(a) a laminated structure in which a first compound semiconductor layer 30 having a first conductive type (more specifically, the n-type conductive type of Example 1) and composed of a GaN base compound semiconductor, a third compound semiconductor layer (active layer) 40 configuring an emission region (gain region) 41 and a saturable absorption region 42 composed of a GaN base compound semiconductor, and a second compound semiconductor layer 50 having a second conductive type (more specifically, the p-type conductive type of Example 1) that is different from the first conductive type and composed of a GaN base compound semiconductor are successively laminated, (b) a second electrode 62 in a belt shape formed on the second compound semiconductor layer 50, and (c) a first electrode 61 electrically connected to the first compound semiconductor layer 30.

Further, the second electrode 62 is separated into a first portion 61 to create a forward bias state by passing the current (forward bias current $I_{gain}$) to the first electrode 61 via the emission region 41 and a second portion 62B to apply an electric field to the saturable absorption region 42 by a separation groove 62C. Specifically, in Example 1, two first portions $62A_1$ and $62A_2$ of the second electrode and one second portion 62B of the second electrode are provided. That is, one edge of the second portion 62B is opposite to one first portion $62A_1$ sandwiching one separation groove $62C_1$ therebetween, and the other edge of the second portion 62B is opposite to the other first portion $62A_2$ sandwiching the other separation groove $62C_2$ therebetween. Moreover, the one saturable absorption region 42 is sandwiched between two emission regions $41_1$ and $41_2$.

Further, the third compound semiconductor layer 40 in the self-oscillating semiconductor laser device of Example 1 has the third compound semiconductor layer includes a quantum well structure having a well layer and a barrier layer, a region of the second compound semiconductor layer apart from the third compound semiconductor layer 40 is mounted with an electron barrier layer 53 having more than 10 nm thick. A distance (d) between the electron barrier layer 53 and the third compound semiconductor layer 40 is $4.5 \times 10^{-8}$ m (45 nm) or more and $8 \times 10^{-8}$ m (80 nm) or less. An impurity doping density of the barrier layer configuring the quantum well structure is 0 or more, and $5 \times 10^{18}$ cm$^{-3}$ or less.

Further, the self-oscillating semiconductor laser device 10 of Example 1 is concretely a semiconductor laser device having a ridge stripe type separate confinement heterostructure (SCH structure). More specifically, the self-oscillating semiconductor laser device 10 is a GaN base semiconductor laser device composed of index guide type AlGaInN developed for a Blu-ray optical disk system and has a linear ridge structure (ridge stripe structure). The self-oscillating semiconductor laser device 10 is provided on a (0001) plane, which is a C plane of the n-type GaN substrate 21, and the third compound semiconductor layer 40 has a quantum well structure. The first compound semiconductor layer 30, the third compound semiconductor layer 40, and the second compound semiconductor layer 50 are concretely composed of an AlGaInN base compound semiconductor and more specifically, have a layer structure shown in Table 1 below. In Table 1, the lower a compound semiconductor layer is described, the closer the layer is to the n-type GaN substrate 21. The band gap of a compound semiconductor constituting a well layer in the third compound semiconductor layer 40 is 3.06 eV.

TABLE 1

| | Example 1 | Comparative Example 1 |
|---|---|---|
| Second compound semiconductor layer 50 | | |
| p-type GaN contact layer (Mg doped) 55 | 0.12 μm | 0.16 μm |
| p-type GaN (Mg doped)/AlGaN superlattice clad layer 54 | 0.4 μm | 0.4 μm |

TABLE 1-continued

| | Example 1 | Comparative Example 1 |
|---|---|---|
| p-type $Al_{0.2}Ga_{0.8}N$ electron barrier layer (Mg doped) 53 | 20 nm | 10 nm |
| non-doped $Al_{0.02}Ga_{0.98}N$ clad layer 52 | 50 nm | (nor formed) |
| non-doped $Ga_{0.98}In_{0.02}N$ optical guide layer 51 | 13 nm | 27 nm |
| Third compound semiconductor layer 40 | | |
| GaInN quantum well active layer | | |
| well layer: $Ga_{0.92}In_{0.08}N$ | 10.5 nm 2 layers | 8 nm 2 layers |
| barrier layer: $Ga_{0.98}In_{0.02}N$ | 14 nm 1 layer | 12 nm 1 layer |
| First compound semiconductor layer 30 | | |
| n-type GaN clad layer 32 | 30 nm | 190 nm |
| n-type AlGaN clad layer 31 | 2.5 μm | 2.4 μm |

A portion of the p-type GaN contact layer 55 and the p-type GaN/AlGaN superlattice clad layer 54 is removed by the RIE method to form a ridge structure (ridge portion 56) of 1.5 μm width. A laminated dielectric film 57 composed of $SiO_2$/Si is formed on both sides of the ridge portion 56. The $SiO_2$ layer is the lower layer and the Si layer is the upper layer. A difference between the effective refractive index of the ridge portion 56 and that of the laminated dielectric film 57 is $5 \times 10^{-3}$ to $1 \times 10^{-2}$ and concretely $7 \times 10^{-3}$. The second electrode (p-side ohmic electrode) 62 is formed on the p-type GaN contact layer 55 corresponding to the top face of the ridge portion 56. On the other hand, the first electrode (n-side ohmic electrode) 61 composed of Ti/Pt/Au is formed on the rear side of the n-type GaN substrate 21.

In the semiconductor laser device 10 of Example 1, the second electrode 62 is separated, as described above, into the first portions $62A_1$, $62A_2$, that create a forward bias state by passing a DC current (forward bias current $I_{gain}$) to the first electrode 61 via the emission region (gain region) $41_1$, $41_2$, the second portion 62B to apply an electric field to the saturable absorption region 42 (the second portion 62B to apply a reverse bias voltage $V_{sa}$ to the saturable absorption region 42), by the separation grooves $62C_1$, $62C_2$. The value of electric resistance (may also be called the "value of separated resistance") between the first portions $62A_1$, $62A_2$, and the second portion 62B of the second electrode 62 is $1 \times 10$ times or more, concretely $1.5 \times 10^3$ times the value of electric resistance between the second electrode 62 and the first electrode 61. The value of electric resistance (value of separated resistance) between the first portions $62A_1$, $62A_2$, and the second portion 62B of the second electrode 62 is $1 \times 10^2 \Omega$ or more, concretely $1.5 \times 10^4 \Omega$.

Incidentally, it is necessary to form the second electrode 62 having the value of separated resistance of $1 \times 10^2 \Omega$ or more on the second compound semiconductor layer 50. In a GaN base semiconductor laser device, in contrast to a GaAs base semiconductor laser device in the related art, the mobility in a compound semiconductor having the p-type conductive type is small and therefore, the value of electric resistance between the first portions $62A_1$, $62A_2$ and the second portion 62B of the second electrode 62 may be made $1 \times 10$ times the value of electric resistance between the second electrode 62 and the first electrode 61 or more or the value of electric resistance between the first portions $62A_1$, $62A_2$ and the second portion 62B of the second electrode 62 may be made $1 \times 10^2 \Omega$ or more by separating the second electrode 62, which is formed on the second compound semiconductor layer 50, by the separation grooves $62C_1$, $62C_2$ without the need to increase the resistance of the second compound semiconductor layer 50 having the p-type conductive type by ion implantation.

Of Example 1, the second electrode 62 is configured by a Pd single layer whose thickness is 0.1 μm. Also of Example 1, the resonator length is set to 0.60 mm, the length of the first portions $62A_1$, $62A_2$ of the second electrode 62 to 0.265 mm, the length of the second portion 62B to 0.03 mm, and the width of the separation grooves $62C_1$, $62C_2$ (the length in the direction of the resonator length) to 0.02 mm.

The thickness of the p-type GaN/AlGaN superlattice clad layer 54 having a superlattice structure in which a p-type GaN layer and a p-type AlGaN layer are alternately laminated is set to 0.7 μm or less, concretely 0.4 μm, the thickness of the p-type GaN layer constituting the superlattice structure to 2.5 nm, the thickness of the p-type AlGaN layer constituting the superlattice structure to 2.5 nm, and the total number of layers of the p-type GaN layer and the p-type AlGaN layer to 160 layers. The distance from the third compound semiconductor layer 40 to the second electrode 62 is 1 μm or less, concretely 0.6 μm. Further, the p-type AlGaN electron barrier layer 53, the p-type GaN/AlGaN superlattice clad layer 54, and the p-type GaN contact layer 55 constituting the second compound semiconductor layer 50 are doped with Mg of $1 \times 10^{19}$ cm$^{-3}$ or more (concretely $2 \times 10^{19}$ cm$^{-3}$) and the absorption coefficient of light whose wavelength is 405 nm by the second compound semiconductor layer 50 is at least 50 cm$^{-1}$, concretely 65 cm$^{-1}$. The second compound semiconductor layer 50 includes non-doped compound semiconductor layers (the non-doped GaInN optical guide layer 51 and the non-doped AlGaN clad layer 52) and p-type compound semiconductor layers from the side of the active layer and the distance from the active layer to a p-type compound semiconductor layer (concretely, the p-type AlGaN electron barrier layer 53) is $4.5 \times 10^{-8}$ m (45 nm) or less, and $8 \times 10^{-8}$ (80 nm) or less, concretely 63 nm. An impurity (concretely, oxygen, O) doping density of the barrier layer configuring the quantum well structure is 0 or more, and $5 \times 10^{18}$ cm$^{-3}$ or less, concretely a doping density of oxygen (O) is $3 \times 10^{18}$ cm$^{-3}$.

Further, in the method of driving the self-oscillating semiconductor laser device of Example 1, current greater than the current value where kink is occurred in optical output-current characteristics is to be passed to the first portion 62A of the second electrode 62. In other words, the current greater than the current value where linearity is eliminated in optical output-current characteristics is to be passed to the first portion 62A of the second electrode 62. A forward bias state is created by passing the current (forward bias current $I_{gain}$) from the first portion 62A of the second electrode 62 to the first electrode 61 via the emission region 41 and an electric field is applied to the saturable absorption region 42 by applying the reverse bias voltage $V_{sa}$ to between the first electrode 61 and the second portion 62B of the second electrode 62 to carry out self-oscillating driving. Further, in the self-oscillating semiconductor laser device of Example 1, there is the relationship of (dF/dL)<0 between the self-oscillating frequency F and the mean light output L when passing the current greater than the current value where kink is occurred in optical output-current characteristics to the first portion 62A of the second electrode 62. Moreover, there is the relationship of (dF/dI)<0 between the self-oscillating frequency F and the current value I to be passed to the first portion 62A of the second electrode 62 when passing the current greater than the current value where kink is occurred in optical output-current characteristics to the first portion 62A of the second electrode 62.

Hereinafter, an explanation will be given on the above mentioned matters. Note that in the following explanation, there may be a case where the current density J, which is current per unit area of the emission region (gain region), is used instead of the current value I.

Figure 3:
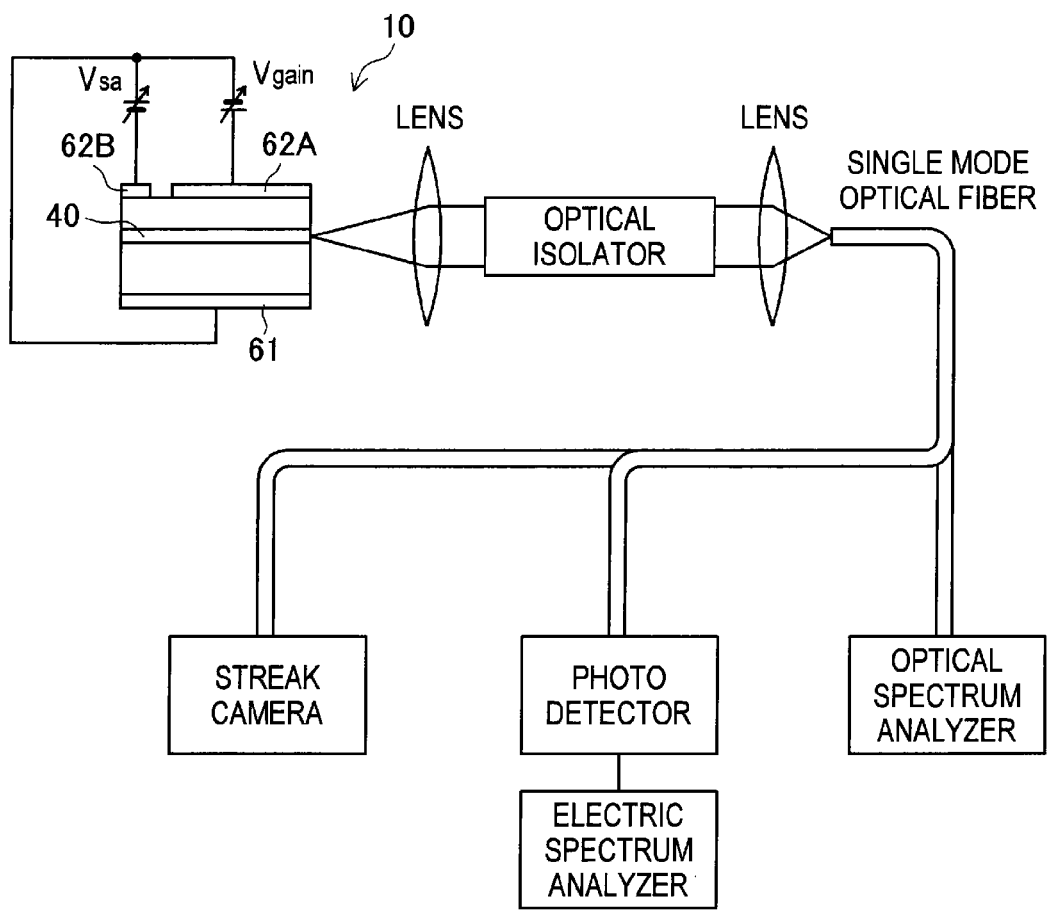
FIG. 3 is a diagram schematically showing a measuring system used for evaluation of a self-pulsation operation of the self-oscillating semiconductor laser device of Example 1.

FIG. 3 shows a measuring system used for evaluation of an operation of the self-oscillating semiconductor laser device 10 of Example 1. In the measurement, the constant DC voltage $V_{sa}$ is applied to the saturable absorption region 42 to pass a DC weak current (voltage $V_{gain}$) to the emission region (gain region) 41. That is, the negative constant DC voltage $V_{sa}$ is applied to the second portion 62B of the second electrode 62 to pass the DC weak current (forward bias current $I_{gain}$) from the first portions $62A_1$, $62A_2$ of the second electrode 62 to the first electrode 61. Then, a laser light emitted from the self-oscillating semiconductor laser device 10 is collimated by a lens and passed through an optical isolator and then, combined with a single mode fiber by a lens to evaluate the light from the single mode fiber by using a photo-detector, electric spectrum analyzer, optical spectrum analyzer, and streak camera.

The characteristics of the self-oscillating semiconductor laser device in the past is shown schematically in (A) to (D) in FIG. 13. A characteristics measurement result of the self-oscillating semiconductor laser device in the Comparative Example 1 having a configuration shown in Table 1 is shown in (A) to (D) in FIG. 13. Moreover, FIG. 5 is an enlarged graph illustrating J-L characteristics in the self-oscillating semiconductor laser device of Example 1 in FIG. 4A. Further FIGS. 6A, 6B, 6C and 5D illustrate graphs with a horizontal axis that has been revised from the one shown in FIGS. 4A to 4D to injection current (forward bias current $I_{gain}$).

Figure 4A:
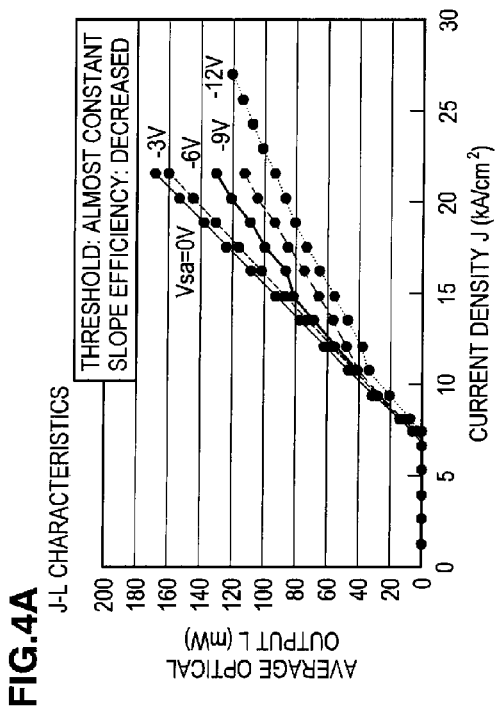
FIG. 4A is a graph illustrating J-L characteristics showing a relationship between a current density J to be injected into an emission region (gain region) and a mean light output L, L-F characteristics showing a relationship between the mean light output L and a self-oscillating frequency F, L-W characteristics showing a relationship between the mean light output L and a pulse width W that has been generated, and L-P characteristics showing the mean light output L and a peak output P in the self-oscillating semiconductor laser device of Example 1.
Figure 4B:
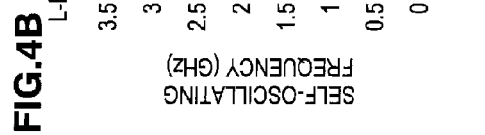
FIG. 4B is a graph illustrating J-L characteristics showing a relationship between the current density J to be injected into an emission region (gain region) and a mean light output L, L-F characteristics showing a relationship between the mean light output L and a self-oscillating frequency F, L-W characteristics showing a relationship between the mean light output L and a pulse width W that has been generated, and L-P characteristics showing the mean light output L and a peak output P in the self-oscillating semiconductor laser device of Example 1.
Figure 4C:
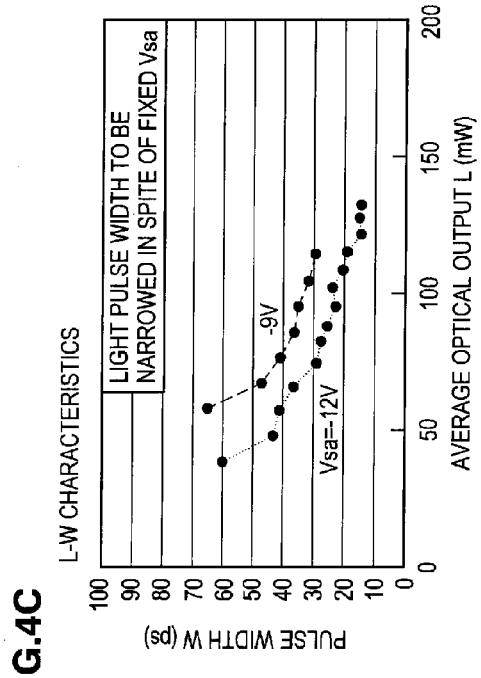
FIG. 4C is a graph illustrating J-L characteristics showing a relationship between the current density J to be injected into an emission region (gain region) and a mean light output L, L-F characteristics showing a relationship between the mean light output L and a self-oscillating frequency F, L-W characteristics showing a relationship between the mean light output L and a pulse width W that has been generated, and L-P characteristics showing the mean light output L and a peak output P in the self-oscillating semiconductor laser device of Example 1.
Figure 4D:
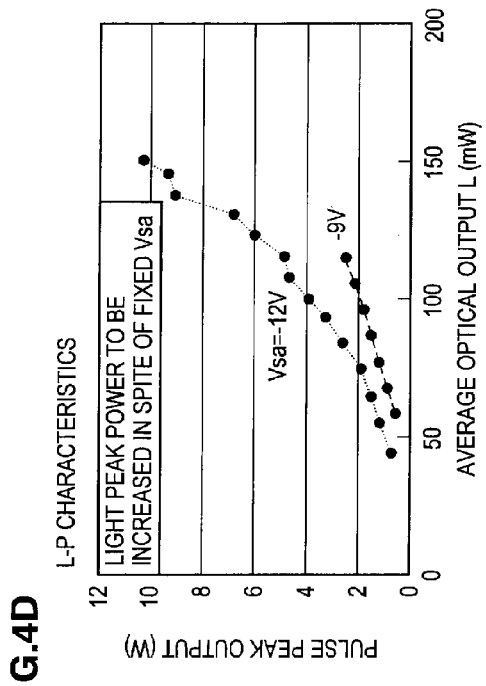
FIG. 4D is a graph illustrating J-L characteristics showing a relationship between the current density J to be injected into an emission region (gain region) and a mean light output L, L-F characteristics showing a relationship between the mean light output L and a self-oscillating frequency F, L-W characteristics showing a relationship between the mean light output L and a pulse width W that has been generated, and L-P characteristics showing the mean light output L and a peak output P in the self-oscillating semiconductor laser device of Example 1.
Figure 5:
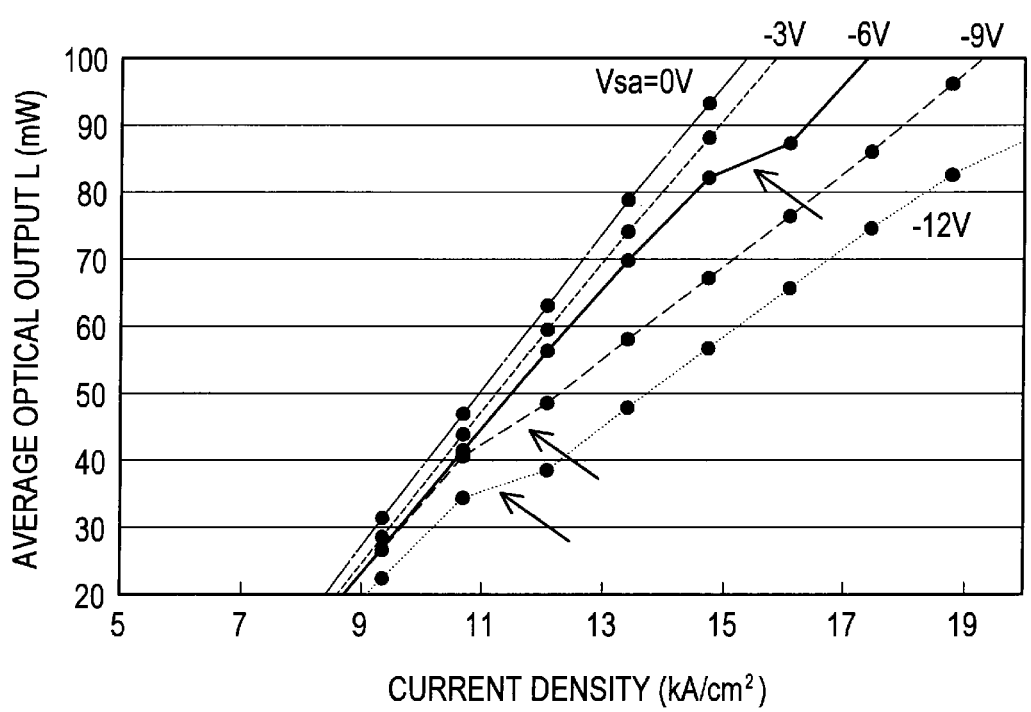
FIG. 5 is an enlarged graph illustrating J-L characteristics in the self-oscillating semiconductor laser device of Example 1 in FIG. 4A.
Figure 6A:
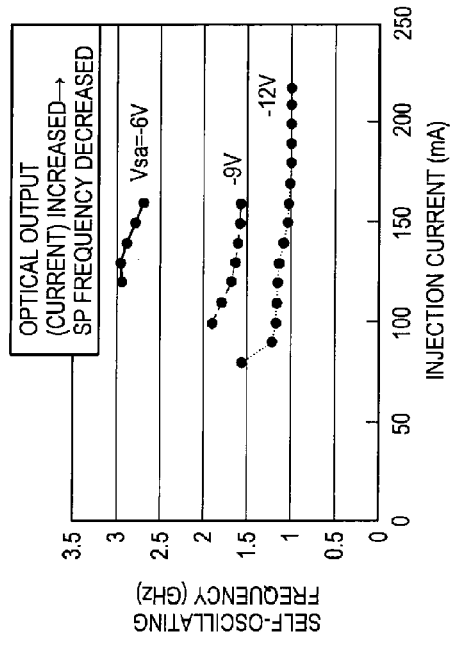
FIG. 6A is a graph with a horizontal axis that has been revised from the one shown in FIGS. 4A to 4D to an injection current (a forward bias current $I_{gain}$)
Figure 6B:
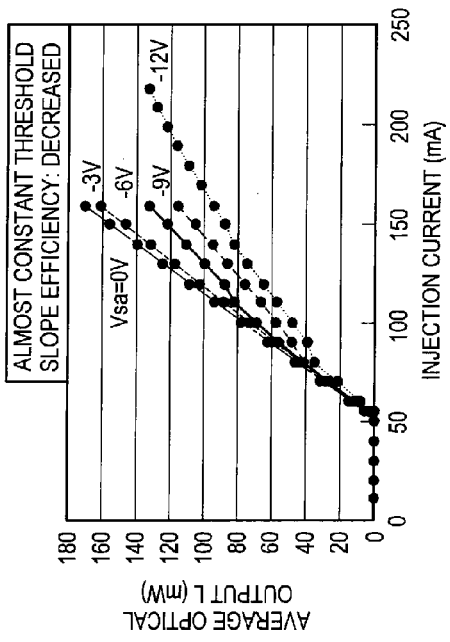
FIG. 6B is a graph with a horizontal axis that has been revised from the one shown in FIGS. 4A to 4D to the injection current (the forward bias current $I_{gain}$)
Figure 6C:
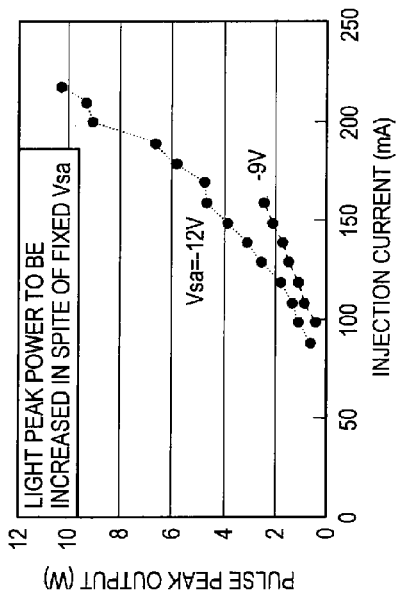
FIG. 6C is a graph with a horizontal axis that has been revised from the one shown in FIGS. 4A to 4D to the injection current (the forward bias current $I_{gain}$)
Figure 6D:
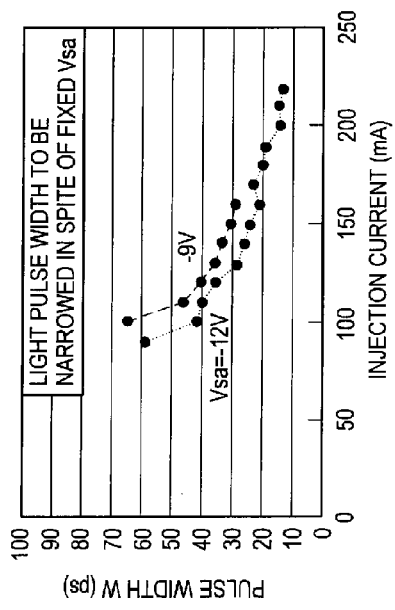
FIG. 6D is a graph with a horizontal axis that has been revised from the one shown in FIGS. 4A to 4D to the injection current (the forward bias current $I_{gain}$)
Figure 13A:
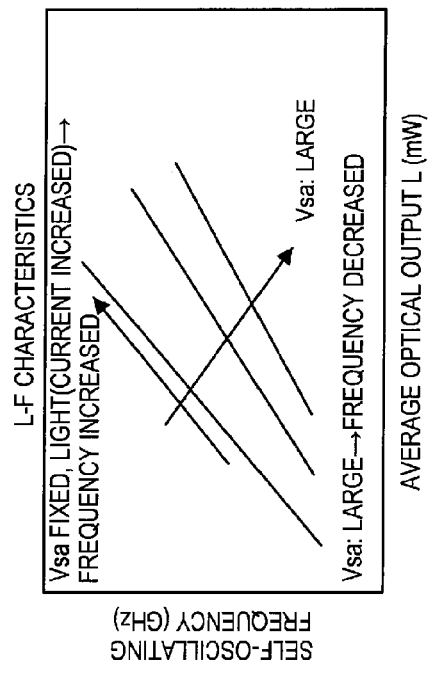
FIG. 13A is a diagram illustrating schematically J-L characteristics showing a relationship between a current density J to be injected into an emission region (gain region) and a mean light output L, L-F characteristics showing a relationship between the mean light output L and a self-oscillating frequency F, L-W characteristics showing a relationship between the mean light output L and a pulse width W that has been generated, and L-P characteristics showing the mean light output L and a peak output P in the self-oscillating semiconductor laser device in the past.
Figure 13B:
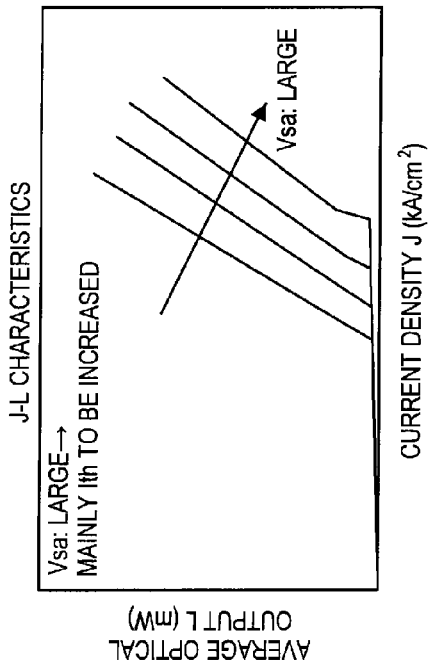
FIG. 13B is a diagram illustrating schematically J-L characteristics showing a relationship between the current density J to be injected into an emission region (gain region) and a mean light output L, L-F characteristics showing a relationship between the mean light output L and a self-oscillating frequency F, L-W characteristics showing a relationship between the mean light output L and a pulse width W that has been generated, and L-P characteristics showing the mean light output L and a peak output P in the self-oscillating semiconductor laser device in the past.
Figure 13C:
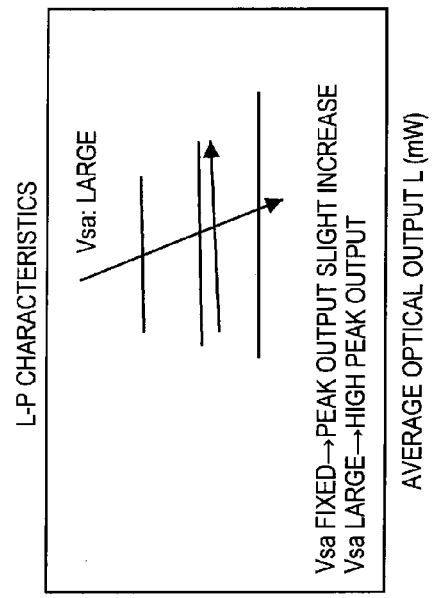
FIG. 13C is a diagram illustrating schematically J-L characteristics showing a relationship between the current density J to be injected into an emission region (gain region) and a mean light output L, L-F characteristics showing a relationship between the mean light output L and a self-oscillating frequency F, L-W characteristics showing a relationship between the mean light output L and a pulse width W that has been generated, and L-P characteristics showing the mean light output L and a peak output P in the self-oscillating semiconductor laser device in the past.
Figure 13D:
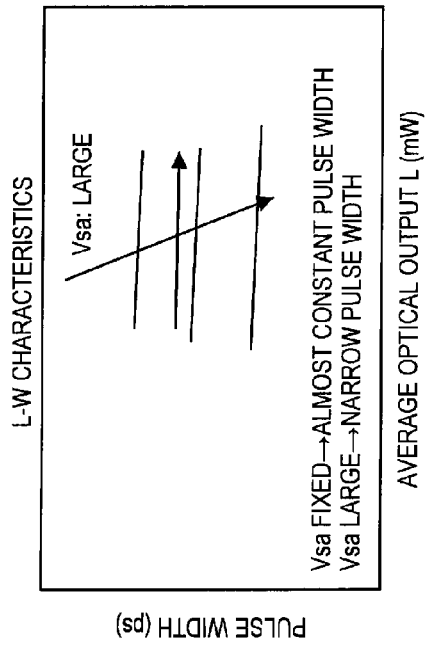
FIG. 13D is a diagram illustrating schematically J-L characteristics showing a relationship between the current density J to be injected into an emission region (gain region) and a mean light output L, L-F characteristics showing a relationship between the mean light output L and a self-oscillating frequency F, L-W characteristics showing a relationship between the mean light output L and a pulse width W that has been generated, and L-P characteristics showing the mean light output L and a peak output P in the self-oscillating semiconductor laser device in the past.
Figure 14A:
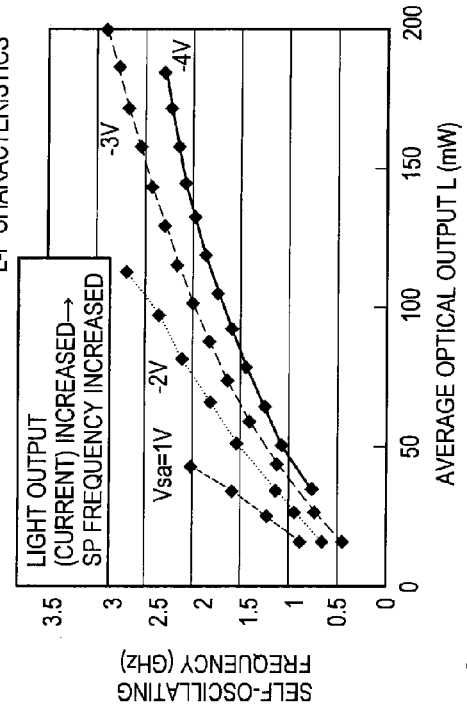
FIG. 14A is a graph illustrating J-L characteristics showing a relationship between the current density J to be injected into an emission region (gain region) and a mean light output L, L-F characteristics showing a relationship between the mean light output L and a self-oscillating frequency F, L-W characteristics showing a relationship between the mean light output L and a pulse width W that has been generated, and L-P characteristics showing the mean light output L and a peak output P in the self-oscillating semiconductor laser device of Comparative Example 1.
Figure 14B:
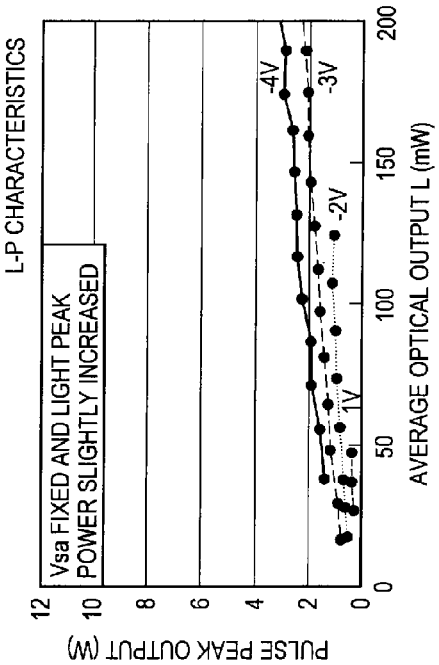
FIG. 14B is a graph illustrating J-L characteristics showing a relationship between the current density J to be injected into an emission region (gain region) and a mean light output L, L-F characteristics showing a relationship between the mean light output L and a self-oscillating frequency F, L-W characteristics showing a relationship between the mean light output L and a pulse width W that has been generated, and L-P characteristics showing the mean light output L and a peak output P in the self-oscillating semiconductor laser device of Comparative Example 1.
Figure 14C:
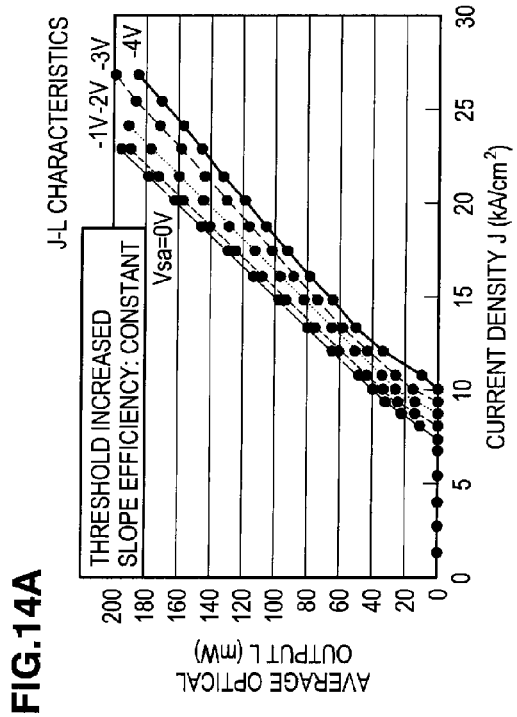
FIG. 14C is a graph illustrating J-L characteristics showing a relationship between the current density J to be injected into an emission region (gain region) and a mean light output L, L-F characteristics showing a relationship between the mean light output L and a self-oscillating frequency F, L-W characteristics showing a relationship between the mean light output L and a pulse width W that has been generated, and L-P characteristics showing the mean light output L and a peak output P in the self-oscillating semiconductor laser device of Comparative Example 1.
Figure 14D:
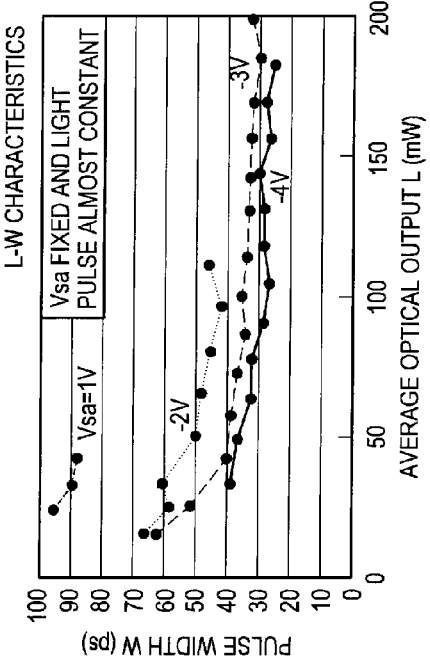
FIG. 14D is a graph illustrating J-L characteristics showing a relationship between the current density J to be injected into an emission region (gain region) and a mean light output L, L-F characteristics showing a relationship between the mean light output L and a self-oscillating frequency F, L-W characteristics showing a relationship between the mean light output L and a pulse width W that has been generated, and L-P characteristics showing the mean light output L and a peak output P in the self-oscillating semiconductor laser device of Comparative Example 1.

FIGS. 4A, 13A and 14A illustrate J-L characteristics showing a relationship between a current density J to be injected into an emission region 41 (gain region) and a mean light output L in the self-oscillating semiconductor laser device of Comparative Example 1. FIGS. 4B, 13B and 14B illustrate L-F characteristics showing a relationship between the mean light output L and a self-oscillating frequency F. Further, FIGS. 4C, 13C and 14C illustrate L-W characteristics showing a relationship between the mean light output L and a pulse width W that has been generated. FIGS. 4D, 13D and 14D illustrate L-P characteristics showing the mean light output L and a peak output P.

The self-oscillating semiconductor laser device in the past shortens carrier lifetime in the emission region 41 (gain region) as the absolute value of the reverse bias voltage $V_{sa}$ to be applied to the saturable absorption region 42 becomes larger, and it increases optical output necessary for saturating the emission region 41. As the result, an in crease of the lasting threshold current density $J_{th}$ can be found in the J-L Characteristics, however, since the emission region 41 becomes almost transparent to the laser light at the time of oscillation, slope efficiency becomes almost steady regardless of the reverse bias voltage $V_{sa}$. As for the L-F Characteristics, if the mean light output L becomes larger when the reverse bias voltage $V_{sa}$ is same (fixed), as the mean light output L becomes larger, gain recovery time in the emission region 41 becomes shorter and the self-oscillating frequency F is increased. Accordingly, relationship of (dF/dL)>0 can be obtained. If the absolute value of the reverse bias voltage $V_{sa}$. is increased, the carrier lifetime in the emission region 41 is decreased, then absorption recovery time in the emission region 41 becomes shorter, and the self-oscillating frequency F is decreased. It is widely known that the pulse width W generated by self-pulsation is determined by photon lifetime and the carrier lifetime in the emission region 41. Therefore, as for the L-F Characteristics, when the reverse bias voltage $V_{sa}$ is same (fixed), the pulse width W stays nearly unchanged. On the contrary, if the absolute value of the reverse bias voltage $V_{sa}$ becomes larger, the carrier lifetime becomes shorter as described before, and the pulse width W is also become shorter. The peak output P can be described as $$P=L/(F \times W)$$

and there is a tendency that due to the L-F characteristics and L-W characteristics, the L-P Characteristics stays nearly unchanged when the reverse bias voltage $V_{sa}$ is the same, and the L-P Characteristics is increased when the absolute value of the reverse bias voltage $V_{sa}$ is increased.

Note that in the self-oscillating semiconductor laser device in Comparative Example 1, the shortest pulse width W was about 30 picosecond, and the highest peak output was 3 watt.

On the contrary, in the self-oscillating semiconductor laser device in Example 1, as for the J-L Characteristics, even though the absolute value of the reverse bias voltage $V_{sa}$ is increased, the lasting threshold current density $J_{th}$ stays nearly unchaged, and the slope efficiency is worsened. When the reverse bias voltage $V_{sa}$ is the same (fixed), as for the L-W Characteristics, the relationship of (dF/dL)<0 can be obtained, in which the self-oscillating frequency F is decreased as well as an increase of the mean light output L. As for the L-W Characteristics, the pulse width W is recognized to have a tendency to be narrower as the mean light output L increases, and as for the J-P Characteristics, there is a tendency that the peak output is tremendously increased along with an increase of the mean light output L. Further, as for the J-L Characteristics, although the transverse-mode is the single mode, kink has found in the forward bias current $I_{gain}$ to be (dF/dL)<0. This is a completely new phenomenon that has never been found in the self-oscillating semiconductor laser device in the past. Further, judging from the finding that kink was obviously recognized when the reverse bias voltage $V_{sa}$–6 volt or less was applied, it is proved that it is preferable to apply the reverse bias voltage $V_{sa}$ whose absolute value is 5 voltage or more (that is, the to apply the reverse bias voltage $V_{sa}$–5 volt or less to the second portion of the second electrode).

Thus, in the method of driving the self-oscillating semiconductor laser device of Example 1, when current greater than the current value where kink is occurred in optical output-current characteristics is to be passed to the first portion of the second electrode, there still is no clear reason, cause, or function or the like found, however, there is the relationship of (dF/dL)<0 between the self-oscillating frequency F and the mean light output L, and there is the relationship of (dF/dI)<0 between the self-oscillating frequency F and the current value I to be passed to the first portion of the second electrode. As the result, the pulse width W becomes narrower as the mean light output L increases, and the peak output P substantially increases as the mean light output L increases. Further, it has become possible to realize higher output of optical pulses than any kind of self-oscillating semiconductor laser device of DC current driving that has been reported in the past.

Comparing configurations of the self-oscillating semiconductor laser device of Example 1 and the self-oscillating semiconductor laser device of Comparative Example 1, the electron barrier layer 53 in the self-oscillating semiconductor laser device of Example 1 is thicker than the one of Comparative Example 1, and the distance between the electron barrier layer and the third compound semiconductor layer is longer than the one of Comparative Example 1. Therefore, the thickness of the electron barrier layer and the distance between the electron barrier layer and the third compound semiconductor layer are estimated to be very influential in the result that there is the relationship of (dF/dL)<0 between the self-oscillating frequency F and the mean light output L and there is the relationship of (dF/dI)<0 between the self-oscillating frequency F and the current value I to be passed to the first portion of the second electrode when passing the current greater than the current value where kink is occurred in optical output-current characteristics to the first portion of the second electrode.

It has been confirmed that in the self-oscillating semiconductor laser device in Comparative Example 1, the shortest pulse width W is about 15 picosecond, and the highest peak output is 10 watt, which is much better in the oscillating characteristics than any other reported self-oscillating semiconductor laser devices.

Moreover, the value of electric resistance between the first portion $62A_1$, $62A_2$ and the second portion $62B$ of the second electrode $62$ is 10 times the value of electric resistance between the second electrode $62$ and the first electrode $61$ or more or $1 \times 10^2 \Omega$ or more. Therefore, the flow of leakage current from the first portions $62A_1$, $62A_2$ of the second electrode $62$ to the second portion $62B$ may reliably be suppressed and, as a result, the emission region $41$ may be put into a forward bias state and besides, the saturable absorption region $42$ may reliably be put into a reverse bias state so that a single mode self-pulsation operation may reliably be caused.

Characteristics demanded of the second electrode $62$ are as follows:

(1) Have a function as an etching mask when the second compound semiconductor layer $50$ is etched.

(2) The second electrode $62$ is wet etchable without causing degradation in optical or electric characteristics of the second compound semiconductor layer $50$.

(3) When a film is formed on the second compound semiconductor layer $50$, the value of contact resistivity of the film is $10^{-2}$ $\Omega cm^2$ or less.

(4) If a laminated structure is adopted, a material constituting a lower metallic layer has a large work function, has a small value of contact resistivity with regard to the second compound semiconductor layer $50$, and is wet etchable.

(5) If a laminated structure is adopted, a material constituting an upper metallic layer is resistant to etching (for example, a $Cl_2$ gas used in the RIE method) when a ridge structure is formed and also wet etchable.

Figure 10:
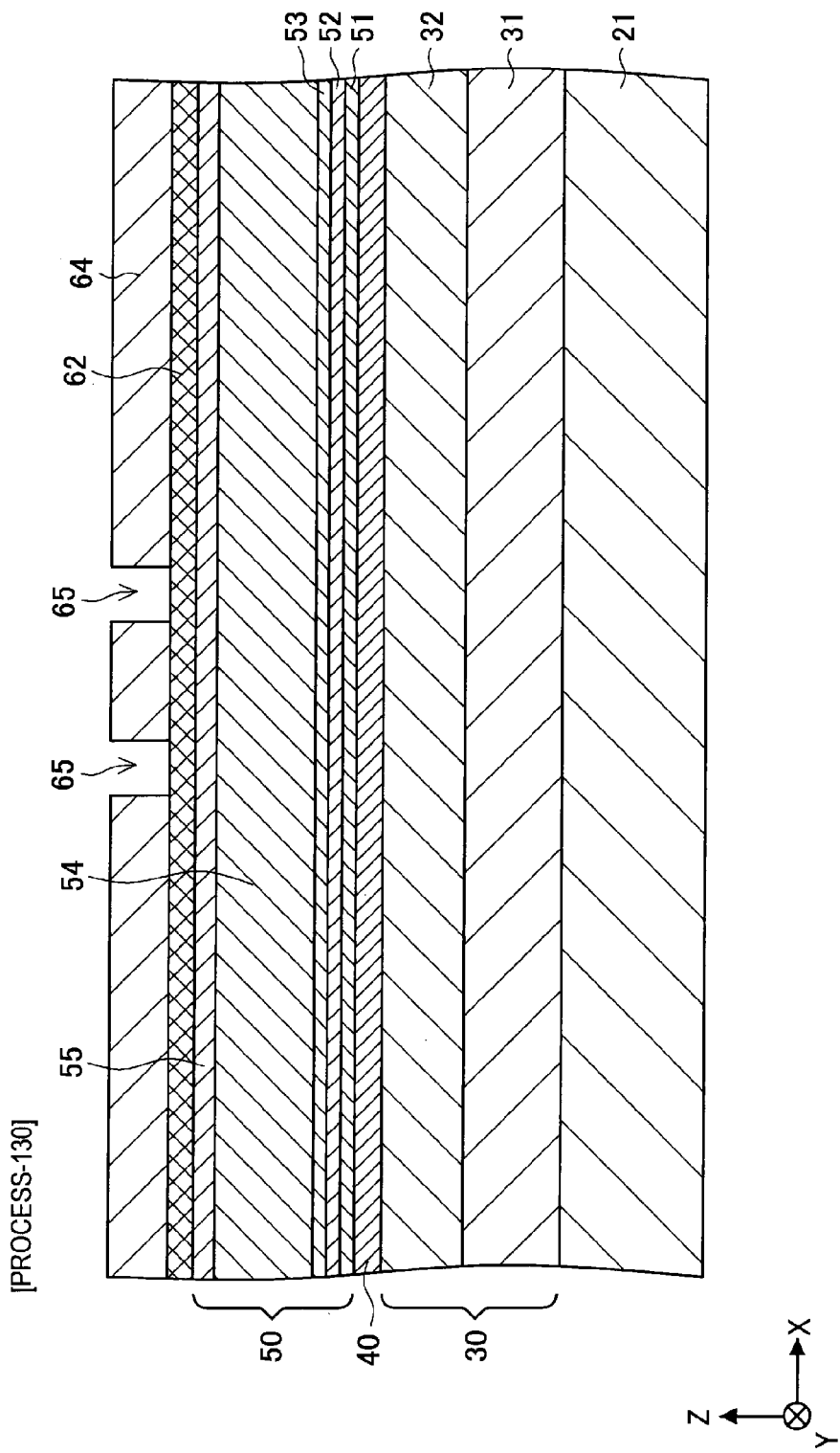
FIG. 10 is continued from FIG. 9B and is a schematic partial sectional view of the substrate and the like to illustrate the manufacturing method of the self-oscillating semiconductor laser device of Example 1.

The manufacturing method of a self-oscillating semiconductor laser device of Example 1 will be described with reference to FIGS. 8A, 8B, 9A, 9B, and 10. FIGS. 8A, 8B, 9A, and 9B are schematic partial sectional views when a substrate or the like is cut by a YZ plane. FIG. 10 is a schematic partial sectional view when a substrate or the like is cut by a XZ plane.

[Process-100]

Figure 8A:
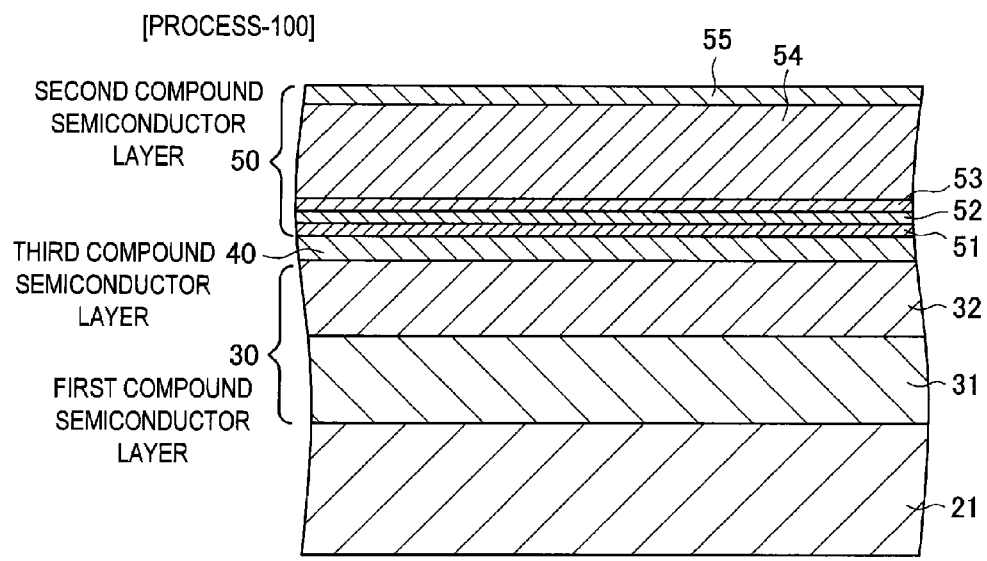
FIG. 8A is a schematic sectional view of the substrate and the like to illustrate the manufacturing method of the self-oscillating semiconductor laser device of Example 1.
Figure 8B:
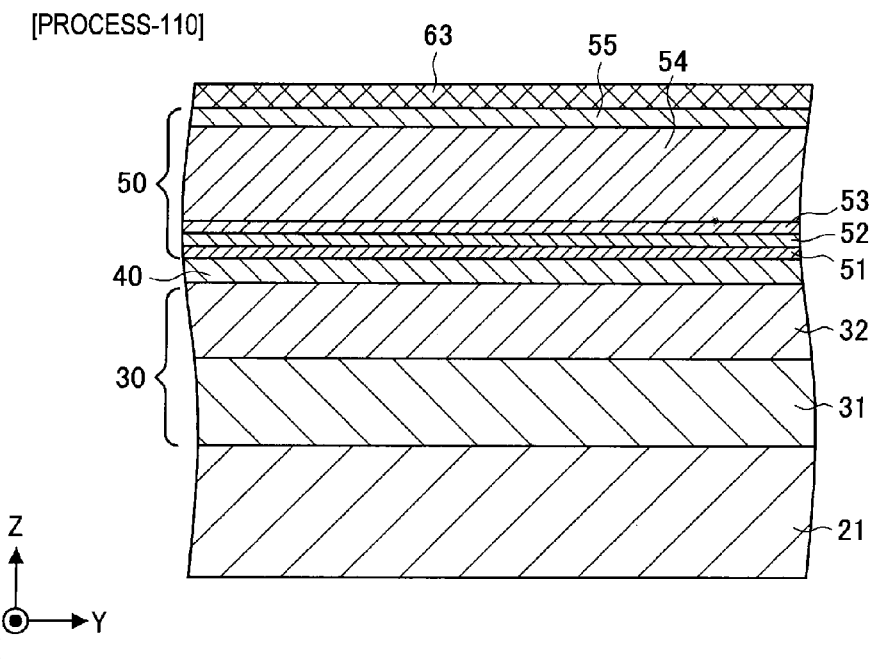
FIG. 8B is a schematic sectional view of the substrate and the like to illustrate the manufacturing method of the self-oscillating semiconductor laser device of Example 1.
Figure 9A:
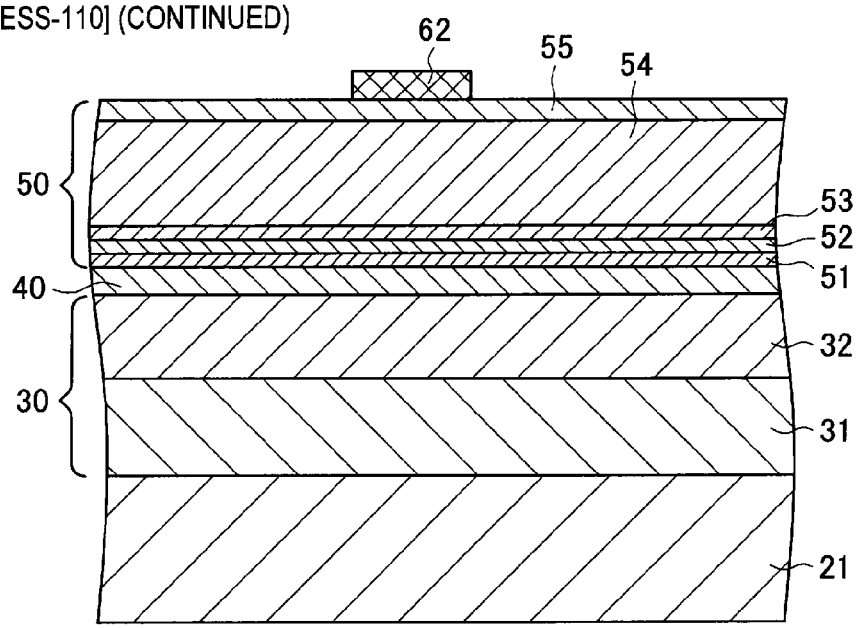
FIG. 9A is continued from FIG. 8B and is a schematic sectional view of the substrate and the like to illustrate the manufacturing method of the self-oscillating semiconductor laser device of Example 1.
Figure 9B:
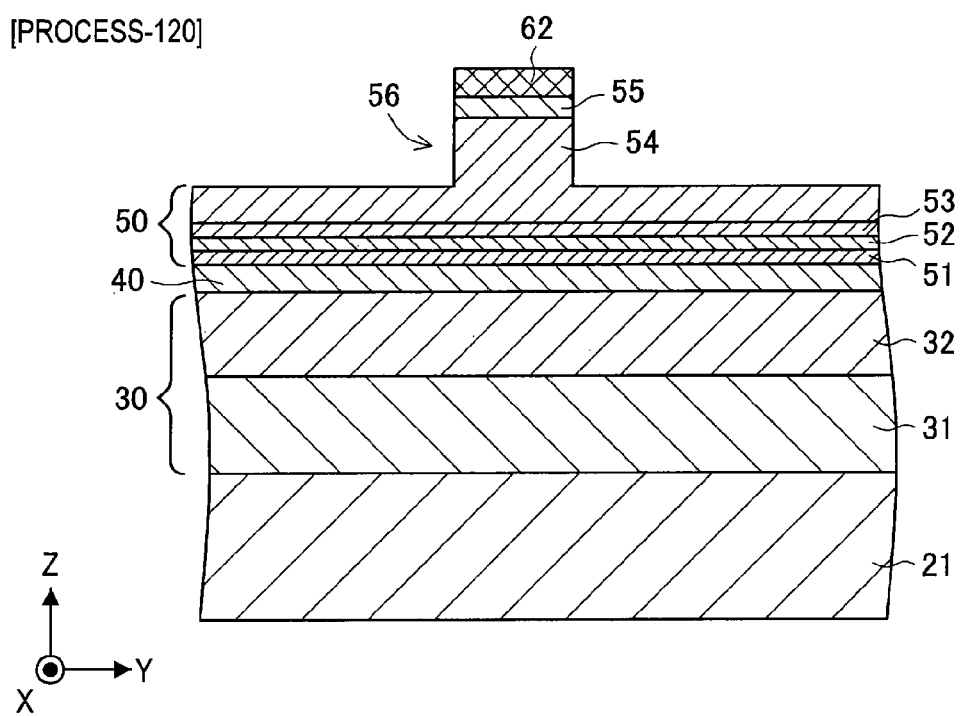
FIG. 9B is continued from FIG. 8B and is a schematic sectional view of the substrate and the like to illustrate the manufacturing method of the self-oscillating semiconductor laser device of Example 1.

A laminated structure in which the first compound semiconductor layer $30$ having the first conductive type (n-type conductive type) and composed of a GaN base compound semiconductor, the third compound semiconductor layer (active layer) $40$ constituting the emission region (gain region) $41$ and the saturable absorption region $42$ composed of a GaN base compound semiconductor, and the second compound semiconductor layer $50$ having the second conductive type (p-type conductive type) that is different from the first conductive type and composed of a GaN base compound semiconductor are successively laminated is first formed on a substrate, concretely a (0001) plane of the n-type GaN substrate $21$ based on the known MOCVD method (see FIG. 8A).

[Process-110]

Subsequently, the second electrode $62$ in a belt shape is formed on the second compound semiconductor layer $50$. More specifically, after forming a Pd layer $63$ all over the second compound semiconductor layer $50$ based on the vacuum evaporation method (see FIG. 8B), a resist layer for etching in a belt shape is formed on the Pd layer $63$ based on photolithography technology. Then, after the Pd layer $63$ not covered with the resist layer for etching being removed using aqua regia, the resist layer for etching is removed. In this way, the structure shown in FIG. 9A may be obtained. Incidentally, the second electrode in a belt shape mat be formed on the second compound semiconductor layer $50$ based on the lift-off method.

[Process-120]

Next, a ridge structure is formed by etching at least a portion of the second compound semiconductor layer $50$ (in Example 1, by etching a portion of the second compound semiconductor layer $50$) using the second electrode $62$ as an etching mask. More specifically, a portion of the second compound semiconductor layer $50$ is etched using the second electrode $62$ as an etching mask based on the RIE method using a $Cl_2$ gas. In this way, the structure shown in FIG. 9B may be obtained. Thus, a ridge structure is formed by the self alignment using the second electrode $62$ patterned in a belt shape as an etching mask and therefore, the second electrode $62$ and the ridge structure will not be misaligned.

[Process-130]

Subsequently, a resist layer $64$ to form a separation groove in the second electrode $62$ is formed (see FIG. 10). Reference numeral $65$ is an opening provided in the resist layer $64$ to form a separation groove. Next, the separation grooves $62C_1$, $62C_2$ are formed in the second electrode $62$ by wet etching using the resist layer $64$ as a wet etching mask to separate the second electrode $62$ into the first portions $62A_1$, $62A_2$ and the second portion $62B$ by the separation grooves $62C_1$, $62C_2$. More specifically, aqua regia is used as an etchant and the separation grooves $62C_1$, $62C_2$ are formed in the second electrode $62$ by soaking the whole second electrode $62$ in aqua regia for about 10 seconds. Then, the resist layer $64$ is subsequently removed. In this way, the structure shown in FIGS. 1 and 2 may be obtained. Thus, in contrast to dry etching, optical or electric characteristics of the second compound semiconductor layer $50$ are not degraded by adopting wet etching. Therefore, emission characteristics of a self-oscillating semiconductor laser device will not be degraded. If dry etching is adopted, the internal loss $\alpha_i$ of the second compound semiconductor layer $50$ increases, which could lead to a rise in threshold voltage or degradation in optical output. If the etching rate of the second electrode $62$ is $ER_0$ and that of the laminated structure is $ER_1$, $ER_0/ER_1 \approx 1 \times 10^{-2}$ is obtained. Thus, there is a high etching selection ratio between the second electrode $62$ and the second compound semiconductor layer $50$ and therefore, the second electrode $62$ may reliably be etched without etching the laminated structure (or only slightly if etched).

[Process-140]

Subsequently, the n-side electrode is formed and the substrate is cleaved and further packaged to produce the semiconductor laser device $10$.

Generally, a resistance R ($\Omega$) of a semiconductor layer may be represented as shown below by using the value of resistivity $\rho$ of a material constituting the semiconductor layer, the length $X_0$ ($\Omega$m) of the semiconductor layer, the cross section S ($m^2$) of the semiconductor layer, the carrier density n ($cm^{-3}$), the amount of charge e (C), and the mobility $\mu$ ($m^2$/Vs):

$$R = (\rho \ X_0)/S$$
$$= X_0/(n \ e \ \mu \ S)$$

When compared with a p-type GaAs base semiconductor, the mobility of a p-type GaN base semiconductor is smaller by two orders of magnitude or more, which is likely to increase the electric resistance value. Thus, it is clear from the above formula that the electric resistance value of a semiconductor laser device having a ridge structure whose cross section is small such as the width 1.5 μm and the height 0.35 μm will be a large value.

Figure 7:
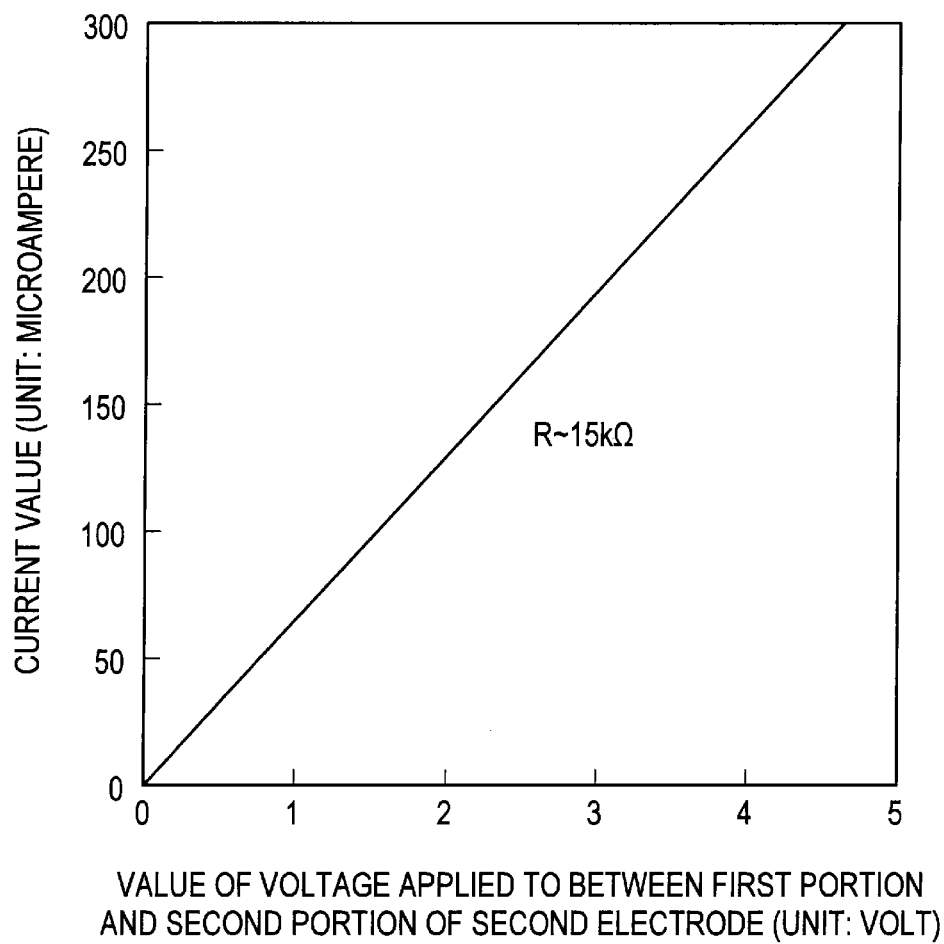
FIG. 7 is a graph showing a result of measuring the value of electric resistance between a first portion and a second portion of a second electrode of the self-oscillating semiconductor laser device obtained of Example 1.

FIG. 7 shows a result of measuring the electric resistance value between the first portions $62A_1$, $62A_2$ and the second portion 62B of the second electrode 62 of the produced self-oscillating semiconductor laser device 10 of Example 1 by the four-terminal method. When the width of the separation grooves $62C_1$, $62C_2$ are 20 μm, the electric resistance value between the first portions $62A_1$, $62A_2$ and the second portion 62B of the second electrode 62 is 15 kΩ.

The configurations of semiconductor laser devices and configurations of structures described in the examples are only illustrations and may be changed if necessary. Various values are shown in the examples, but these values are also only illustrations and if, for example, the specification of the semiconductor laser device to be used changes, also such values naturally change. For example, a laminated structure has a lower metallic layer composed of palladium (Pd) whose thickness is 20 nm and an upper metallic layer composed of nickel (Ni) whose thickness is 200 nm. Incidentally, in wet etching by aqua regia, the etching rate of nickel is about 1.25 times that of palladium. In the above examples, the self-oscillating semiconductor laser device 10 is provided on the C plane, which is a polar plane of the n-type GaN substrate 21, or {0001} plane, but the self-oscillating semiconductor laser device 10 may alternatively be provided on an A plane, which is a {11-20} plane, an M plane, which is a {1-100} plane, a non-polar plane such as a {1-102} plane, or a {11-2n} plane containing a {11-24} plane and a {11-22} plane or a semi-polar plane such as a {10-11} plane and {10-12} plane and accordingly, even if piezo polarization or spontaneous polarization arises in the active layer of the self-oscillating semiconductor laser device 10, piezo polarization will not arise in the thickness direction of the active layer and instead, piezo polarization and spontaneous polarization arises in a direction substantially perpendicular to the thickness direction of the active layer so that phenomenon, such as shift in the luminous wavelength, higher operating voltage, lower luminance efficiency, luminance saturation, or the like, may be eliminated. The {11-2n} plane means a non-polar plane forming 40 degrees with respect to approximately the C plane.

For example, a second electrode has a lower metallic layer composed of palladium (Pd) whose thickness is 20 nm and an upper metallic layer composed of nickel (Ni) whose thickness is 200 nm. Incidentally, in wet etching by aqua regia, the etching rate of nickel is about 1.25 times that of palladium.

Figure 11:
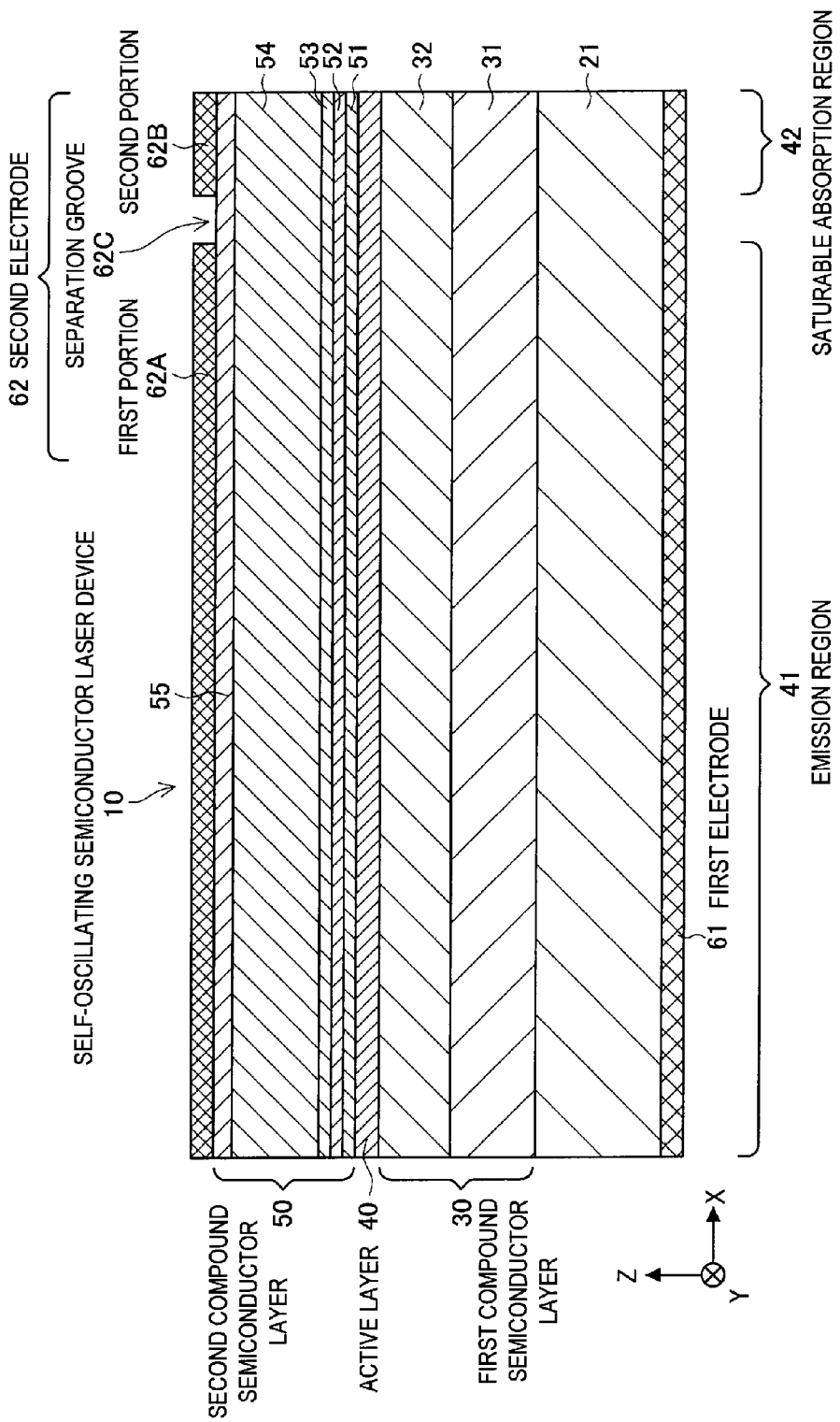
FIG. 11 is a schematic sectional view along a direction in which a modified resonator of a self-oscillating semiconductor laser device of Example 1 extends.
Figure 12:
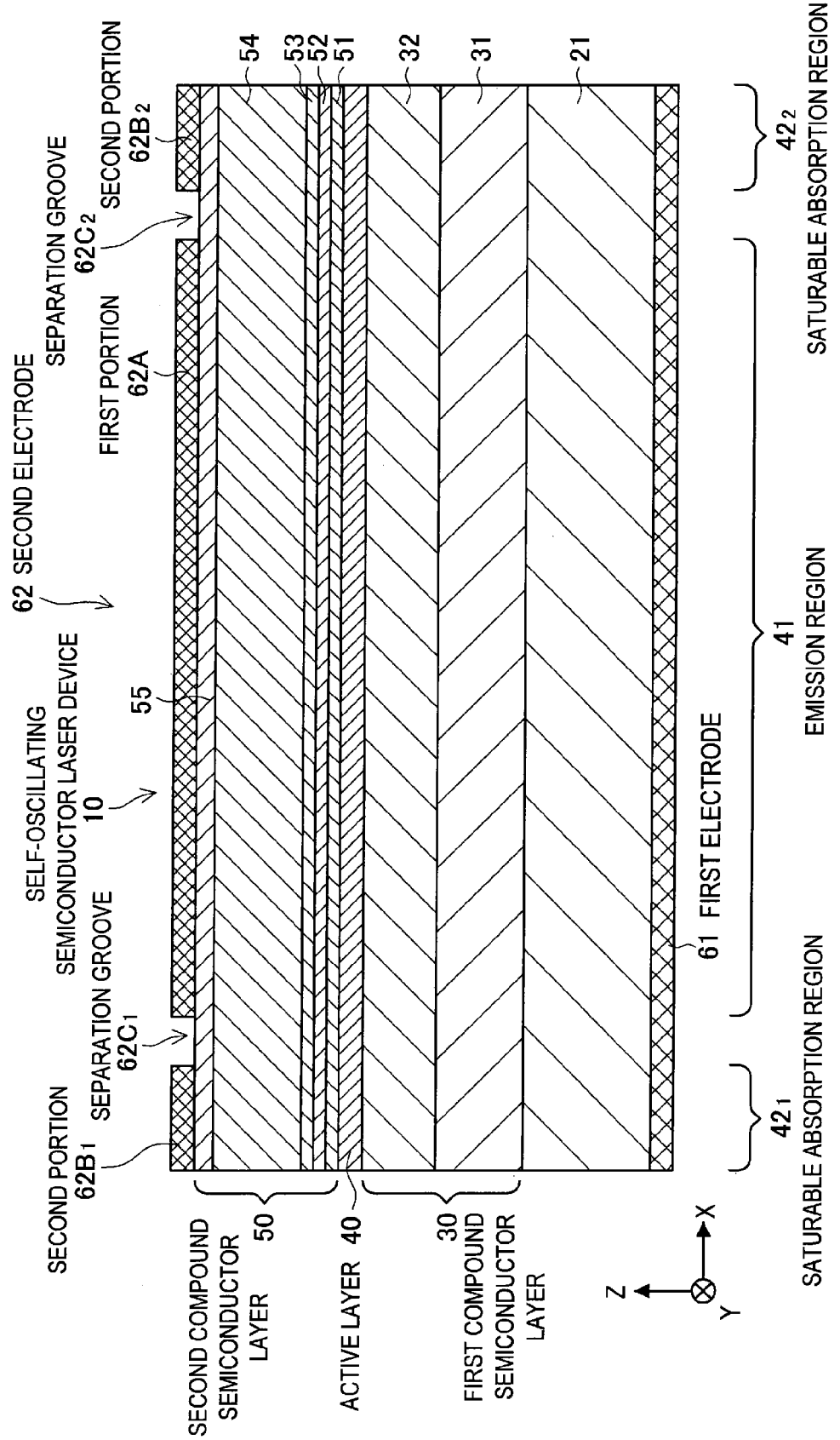
FIG. 12 is a schematic sectional view along a direction in which another modified resonator of a self-oscillating semiconductor laser device of Example 1 extends.

The number of the emission region 41 and that of the saturable absorption region 42 are not limited to two. FIG. 11 shows a schematic end face diagram of a self-oscillating semiconductor laser device in which one first portion 62A of the second electrode and one second portion 62B of the second electrode are provided. FIG. 12 shows a schematic end face diagram of a self-oscillating semiconductor laser device in which one first portion 62A of the second electrode and two second portions $62B_1$, $62B_2$ of the second electrode are provided. In this self-oscillating semiconductor laser device, one edge of the first portion 62A is opposite to one second portion $62B_1$ sandwiching one separation groove $62C_1$ therebetween, and the other edge of the first portion 62A is opposite to the other second portion $62B_2$ sandwiching the other separation groove $62C_2$ therebetween. Moreover, the one saturable absorption region 41 is sandwiched between two emission regions $42_1$, $42_2$.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A driving method of a self-oscillating semiconductor laser device comprising:
    (a) a laminated structure in which a first compound semiconductor layer having a first conductive type and composed of a GaN base compound semiconductor, a third compound semiconductor layer configuring an emission region and a saturable absorption region composed of the GaN base compound semiconductor, and a second compound semiconductor layer having a second conductive type that is different from the first conductive type and composed of the GaN base compound semiconductor are successively laminated;
    (b) a second electrode formed on the second compound semiconductor layer, wherein a region of the second compound semiconductor layer apart from the third compound semiconductor layer is mounted with an electron barrier layer having a thickness higher than 10 nm and a distance between the electron barrier layer and the third compound semiconductor layer is $4.5 \times 10^{-8}$ m or more and $8 \times 10^{-8}$ m or less; and
    (c) a first electrode electrically connected to the first compound semiconductor layer,
    wherein the second electrode is separated into a first portion to create a forward bias state by passing current to the first electrode via the emission region and a second portion to apply an electric field to the saturable absorption region by a separation groove, the method including passing a current greater than a current value where kink is occurred in optical output-current characteristics is to be passed to the first portion of the second electrode.

2. The driving method of a self-oscillating semiconductor laser device according to claim 1, further including
    applying reverse bias voltage whose absolute value is 5 volt or more to the second portion of the second electrode.

3. The driving method of a self-oscillating semiconductor laser device according to claim 1, wherein a transverse-mode is a single mode.

4. The driving method of a self-oscillating semiconductor laser device according to claim 1,
    wherein there is relationship of (dF/dL)<0 between a self-oscillating frequency F and a mean light output L.

5. The driving method of a self-oscillating semiconductor laser device according to claim 1, wherein there is relationship of (dF/dI)<0 between the self-oscillating frequency F and a current value I to be passed to the first portion of the second electrode.

6. The driving method of a self-oscillating semiconductor laser device according to claim 1, wherein the third compound semiconductor layer includes a quantum well structure having a well layer and a barrier layer.

7. The driving method of a self-oscillating semiconductor laser device according to claim 6, wherein an impurity doping density is 0 or more and $5\times10^{-18}$ cm$^{-3}$ or less.

8. The driving method of a self-oscillating semiconductor laser device according to claim 1, wherein a value of electric resistance between the first portion and the second portion of the second electrode is $1\times10^2$ Ω or more.

9. The driving method of a self-oscillating semiconductor laser device according to claim 1, wherein the separation groove that separates the second electrode into the first portion and the second portion has a width of 1 μm or more.

10. The driving method of a self-oscillating semiconductor laser device according to claim 1, wherein the second electrode has a structure in which the second portion is sandwiched between the first portions.

11. The driving method of a self-oscillating semiconductor laser device according to claim 1, wherein a separate confinement heterostructure of ridge stripe type is included.

12. A self-oscillating semiconductor laser device comprising:
(a) a laminated structure in which a first compound semiconductor layer having a first conductive type and composed of a GaN base compound semiconductor, a third compound semiconductor layer configuring an emission region and a saturable absorption region composed of the GaN base compound semiconductor, and a second compound semiconductor layer having a second conductive type that is different from the first conductive type and composed of the GaN base compound semiconductor are successively laminated;
(b) a second electrode formed on the second compound semiconductor layer; wherein a region of the second compound semiconductor layer apart from the third compound semiconductor layer is mounted with an electron barrier layer having a thickness higher than 10nm; and
(c) a first electrode electrically connected to the first compound semiconductor layer,
wherein the second electrode is separated into a first portion to create a forward bias state by passing current to the first electrode via the emission region and a second portion to apply an electric field to the saturable absorption region by a separation groove, and
the third compound semiconductor layer includes a quantum well structure having a well layer and a barrier layer,
a distance between the electron barrier layer is $4.5\times10^{-8}$ m or more and $8\times10^{-8}$ m or less, and
there is relationship of (dF/dL)<0 between the self-oscillating frequency F and the mean light output L when the current greater than the current value where kink is occurred in optical output-current characteristics is to be passed to the first portion of the second electrode.

13. The self-oscillating semiconductor laser device according to claim 12, wherein a transverse-mode is a single mode.

14. The self-oscillating semiconductor laser device according to claim 12, wherein an impurity doping density is 0 or more and $5\times10^{-18}$ cm$^{-3}$ or less.

15. The self-oscillating semiconductor laser device according to claim 12, wherein a value of electric resistance between the first portion and the second portion of the second electrode is $1\times10^2$Ω or more.

16. The self-oscillating semiconductor laser device according to claim 12, wherein the separation groove that separates the second electrode into the first portion and the second portion has a width of 1 μm or more.

17. The self-oscillating semiconductor laser device according to claim 12, wherein the second electrode has a structure in which the second portion is sandwiched between the first portion.

18. The self-oscillating semiconductor laser device according to claim 12, wherein a separate confinement heterostructure of ridge stripe type is included.

19. A self-oscillating semiconductor laser device comprising:
(a) a laminated structure in which a first compound semiconductor layer having a first conductive type and composed of a GaN base compound semiconductor, a third compound semiconductor layer configuring an emission region and a saturable absorption region composed of the GaN base compound semiconductor, and a second compound semiconductor layer having a second conductive type that is different from the first conductive type and composed of the GaN base compound semiconductor are successively laminated;
(b) a second electrode formed on the second compound semiconductor layer, wherein a region of the second compound semiconductor layer apart from the third compound semiconductor layer is mounted with an electron barrier layer having a thickness higher than 10 nm;and
(c) a first electrode electrically connected to the first compound semiconductor layer,
wherein the second electrode is separated into a first portion to create a forward bias state by passing current to the first electrode via the emission region and a second portion to apply an electric field to the saturable absorption region by a separation groove, and
the third compound semiconductor layer includes a quantum well structure having a well layer and a barrier layer,
a distance between the electron barrier layer is $4.5\times10^{-8}$ m or more and $8\times10^{-8}$ m or less, and
there is relationship of (dF/dI)<0 between the self-oscillating frequency F and the current value I to be passed to the first portion of the second electrode when passing the current greater than the current value where kink is occurred in optical output-current characteristics is to be passed to the first portion of the second electrode.

* * * * *